US009000309B2

(12) United States Patent
Saneto et al.

(10) Patent No.: US 9,000,309 B2
(45) Date of Patent: *Apr. 7, 2015

(54) ELECTROMAGNETIC SHIELDING FILM

(75) Inventors: Ryuji Saneto, Minami-ashigara (JP); Megumi Sekiguchi, Minami-ashigara (JP); Hiroshi Ishizuka, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 324 days.

This patent is subject to a terminal disclaimer.

(21) Appl. No.: 13/423,703

(22) Filed: Mar. 19, 2012

(65) Prior Publication Data

US 2012/0175164 A1     Jul. 12, 2012

Related U.S. Application Data

(63) Continuation of application No. 12/116,305, filed on May 7, 2008, now Pat. No. 8,426,749.

(30) Foreign Application Priority Data

May 9, 2007  (JP) ................................. 2007-124696

(51) Int. Cl.
*H05K 9/00* (2006.01)
*G02F 1/1333* (2006.01)

(52) U.S. Cl.
CPC .. *H05K 9/0096* (2013.01); *G02F 2001/133334* (2013.01)

(58) Field of Classification Search
CPC .................................................... H05K 9/0096
USPC ............................ 358/533; 174/381, 389, 392
See application file for complete search history.

(56) References Cited

U.S. PATENT DOCUMENTS

| 4,516,175 A | 5/1985 | Jung et al. |
| 2006/0115636 A1 | 6/2006 | Yoshida et al. |
| 2007/0190296 A1 | 8/2007 | Yoshikawa et al. |

(Continued)

FOREIGN PATENT DOCUMENTS

| JP | 05-327274 | 12/1993 |
| JP | 11-150388 | 6/1999 |

(Continued)

OTHER PUBLICATIONS

United States Official Action—U.S. Appl. No. 12/116,305—Sep. 14, 2012.

(Continued)

*Primary Examiner* — Hung V Ngo
(74) *Attorney, Agent, or Firm* — Young & Thompson

(57) ABSTRACT

An electromagnetic shielding film comprises a conductive portion and an opening portion, and a moire preventing part is formed in the opening portion. The moire preventing part may be formed approximately at the center of the opening portion, and may be formed on a line connecting intersections facing each other in the conductive portion in the mesh pattern. The moire preventing part may have a substantially circular planar shape or a polygonal planar shape (such as a quadrangular, pentagonal, hexagonal, or octagonal shape). Of course the moire preventing part may have an at least partially curved planar shape. The electromagnetic shielding film preferably satisfies the inequality $0.1Sa \leq Sb \leq 5.0Sa$, in which Sa is the area of the intersection of the conductive portion and Sb is the area of the moire preventing part.

17 Claims, 10 Drawing Sheets

(56) References Cited

U.S. PATENT DOCUMENTS

| | | |
|---|---|---|
| 2007/0190860 A1 | 8/2007 | Park |
| 2007/0194714 A1 | 8/2007 | Sohn |
| 2007/0212536 A1 | 9/2007 | Okada et al. |
| 2007/0231587 A1 | 10/2007 | Naito et al. |
| 2007/0257591 A1 | 11/2007 | Park et al. |
| 2007/0291463 A1 | 12/2007 | Ojiri et al. |
| 2008/0130296 A1 | 6/2008 | Sugimachi et al. |
| 2008/0200333 A1 | 8/2008 | Gotou et al. |
| 2008/0230393 A1 | 9/2008 | Okazaki et al. |
| 2008/0245563 A1 | 10/2008 | Naito et al. |
| 2008/0272697 A1 | 11/2008 | Cha et al. |
| 2008/0277157 A1 | 11/2008 | Naito et al. |
| 2010/0149672 A1* | 6/2010 | Lee et al. ................ 359/885 |

FOREIGN PATENT DOCUMENTS

| | | |
|---|---|---|
| JP | 11-170420 | 6/1999 |
| JP | 11-177272 | 7/1999 |
| JP | 11-317593 | 11/1999 |
| JP | 11-330774 | 11/1999 |
| JP | 2000-066614 | 3/2000 |
| JP | 2000-223036 | 8/2000 |
| JP | 2002-55624 | 2/2002 |
| JP | 2003-046293 | 2/2003 |
| JP | 2004-068119 | 3/2004 |
| JP | 2004-068120 | 3/2004 |
| JP | 2004-172041 | 6/2004 |
| JP | 2004-221564 | 8/2004 |
| JP | 2006-12935 | 1/2006 |
| WO | WO 2004/007810 | 1/2004 |

OTHER PUBLICATIONS

Rejection of the Application issued Jun. 5, 2012 by the Japanese Patent Office in related Japanese Patent Application No. 2008-122083, 7 pages.

European Search Report, mailed Mar. 24, 2011 in corresponding European Application No. 08008575.6.

* cited by examiner

ELECTROMAGNETIC SHIELDING FILM

CROSS REFERENCE TO RELATED APPLICATIONS

This application is a continuation of co-pending application Ser. No. 12/116,305 filed on May 7, 2008, which claims foreign priority to Japanese application No. 2007-124696 filed on May 9, 2007. The entire content of each of these applications is hereby expressly incorporated by reference.

BACKGROUND OF THE INVENTION

1. Field of the Invention

The present invention relates to an electromagnetic shielding film and an optical filter, particularly to an electromagnetic shielding film and an optical filter that are light transmittable and capable of shielding electromagnetic waves from front surfaces of display devices such as CRTs (cathode ray tubes), PDPs (plasma display panels), liquid crystal displays, EL (electroluminescence) displays, and FEDs (field emission displays), microwave ovens, electronic devices, printed circuit boards, and the like.

2. Description of the Related Art

Problems of electro-magnetic interference (EMI) have been rapidly increasing in recent years along with increase in the use of various electric and applied-electronic equipments. It has been indicated that the EMI causes malfunction or failure of the electronic or electric equipment, and further causes health disorder of an operator of the equipment. Therefore, the electronic and electric equipments are required to reduce the intensity of an electromagnetic wave therefrom to make it within a standard or a regulation.

The electromagnetic wave has to be shielded to solve the EMI problems, and a metal having a non-transmissivity to the electromagnetic wave can be utilized for the shielding obviously. For example, the electromagnetic wave can be shielded by a method of using a housing of a metal or a highly conductive material, a method of inserting a metal plate between circuit boards, a method of covering a cable with a metal foil, etc. Display devices such as CRTs and PDPs need to be light transmittable such that the operator can recognize characters shown on the screen. However, in the case of using the above methods, the front surface of the display device is likely to be opaque. Thus, the methods are unsuitable for shielding the electromagnetic wave from the display devices.

Particularly the PDPs generate a larger amount of the electromagnetic wave as compared with the CRTs or the like, whereby electromagnetic shielding materials for the PDPs are required to have a higher electromagnetic shielding ability. The electromagnetic shielding ability can be simply represented by the surface resistance. The light transmittable, electromagnetic shielding materials for the PDPs need to have a surface resistance of 2.5 $\Omega$/sq or less, while those for the CRTs need to have a surface resistance of about 300 $\Omega$/sq or less. In a consumer plasma television using the PDP, the electromagnetic shielding material is required to have a remarkably high conductivity with a surface resistance of 1.5 $\Omega$/sq or less, more desirably 0.1 $\Omega$/sq or less.

The light transmittance of the electromagnetic shielding material is required to be about 70% or more in the CRT and about 80% or more in the PDP, and there is a demand for further improving the light transmittance.

Generally a film material produced by forming a metal mesh on a film is used as the electromagnetic shielding material for the plasma display panel (PDP) having excellent light transmittance and high electromagnetic shielding properties. However, a moire is often generated due to interference between the film material and a pixel pattern of the PDP.

Conventional fiber meshes have large wire widths to achieve high conductivity, and thereby the moire is easily generated (see Japanese Laid-Open Patent Publication No. 5-327274, etc.) The moire can be effectively reduced by thinning a wire of the mesh pattern. For example, a thin wire having a width of about 10 $\mu$m obtained by etching a copper foil is described in Japanese Laid-Open Patent Publication No. 2003-046293. However, this method is disadvantageous in complicated production process and in high cost.

As a method for forming the mesh pattern with improved productivity, an electroless plating method, which contains printing fine metal particles as a catalyst and depositing a conductive metal on the printed fine metal particles, is disclosed in Japanese Laid-Open Patent Publication Nos. 11-170420, 2004-068119, and 2004-068120. Further, a mesh pattern forming method using a silver salt diffusion transfer process is proposed in WO 2004/007810 and Japanese Laid-Open Patent Publication No. 2004-172041. However, in these methods, when the wire width of the mesh pattern is reduced, the surface resistance representing the electromagnetic shielding property is increased. Further, these methods are poor in wire resolution. Thus, in these methods, the mesh pattern has a large wire width of 20 to 30 $\mu$m, so that the moire cannot be sufficiently reduced.

Further, a method of developing a silver halide to form a conductive mesh of metallic silver, and a method of plating the developed silver mesh with copper to form a conductive mesh are proposed in Japanese Laid-Open Patent Publication No. 2004-221564, etc.

The problem of the moire can be solved to some extent by optimizing the bias angle of the mesh for each of PDP pixel patterns. However, a large number of suitable films are needed for the PDP pixel patterns, whereby this method is disadvantageous in increased cost and storage. To reduce the number of the films, it is necessary to produce an electromagnetic shielding material having a wide acceptable angular range within which the moire is not generated by the PDP pixel pattern.

In the case of improving the productivity by selecting the mesh forming method, the surface resistance is increased by reducing the wire width, or the wire width cannot be reduced due to limitations of thin wire mesh resolution, so that the moire is often increased. Thus, there is a demand for a method for reducing the moire without thinning the metal wire in the mesh.

Under such circumstances, an object of the present invention is to provide an electromagnetic shielding film and an optical filter that are highly light transmittable and electromagnetic shieldable, and capable of minimizing image quality deterioration due to moire or the like.

In ordinary crossed mesh patterns, in the relation between the moire and the wire width, the moire is unnoticeable when the wire is thin, for example, at a wire width of 10 $\mu$m or less, whereas the moire is highly visible when the wire becomes thicker, for example, at a wire width of 15 $\mu$m or more. As described above, as the wire of the mesh is thickened (widened), the moire is increased. Though the moire can be effectively reduced by thinning the wire of the mesh pattern, the thinning results in surface resistance increase and complicated production process disadvantageously.

SUMMARY OF THE INVENTION

In intense research in view of solving the above problem, the inventor has found that the moire can be reduced by disposing a moire preventing part in an opening portion formed in a mesh line. This seems because, by forming the moire preventing part, the integral quantity of a light transmitted through a conductive metal thin film mesh is made substantially uniform in wire intersections and the other positions as if the mesh pattern is not present, so that the moire is hardly generated.

The present invention has been achieved as a result of research based on the finding that the moire can be reduced by disposing the moire preventing part in the opening portion of an electromagnetic shielding film having the opening portion and the conductive portion.

Thus, the above object of the present invention is achieved by the following aspects.

[1] An electromagnetic shielding film according to a first aspect of the present invention, comprising a conductive portion and an opening portion, a moire preventing part being formed in the opening portion.

[2] An electromagnetic shielding film according to the first aspect of the present invention, wherein the conductive portion and the opening portion are combined into a mesh pattern.

[3] An electromagnetic shielding film according to the first aspect of the present invention, wherein the moire preventing part is formed approximately at the center of the opening portion.

[4] An electromagnetic shielding film according to the first aspect of the present invention, wherein intersections facing each other are formed in the conductive portion in the mesh pattern, and the moire preventing part is formed on a line connecting the intersections in the opening portion.

[5] An electromagnetic shielding film according to the first aspect of the present invention, wherein a first intersection and a second intersection facing each other, and a third intersection and a fourth intersection facing each other are formed around the opening portion, and the moire preventing part is formed at the intersection point of a first line connecting the first and second intersections and a second line connecting the third and fourth intersections.

[6] An electromagnetic shielding film according to the first aspect of the present invention, wherein an intersection is formed in the conductive portion in the mesh pattern, and the electromagnetic shielding film satisfies the following inequality:

$$0.1 Sa \leq Sb \leq 5.0 Sa$$

wherein Sa is the area of the intersection and Sb is the area of the moire preventing part.

[7] An electromagnetic shielding film according to the first aspect of the present invention, wherein an intersection is formed in the conductive portion in the mesh pattern, and the electromagnetic shielding film satisfies the following inequality:

$$0.1 Sa \leq Sb \leq 1.9 Sa$$

wherein Sa is the area of the intersection and Sb is the area of the moire preventing part. The moire preventing effect can be further improved by optimizing the areas of the moire preventing part and the intersection of the conductive portion.

[8] An electromagnetic shielding film according to the first aspect of the present invention, wherein the moire preventing part has a substantially circular planar shape.

[9] An electromagnetic shielding film according to the first aspect of the present invention, wherein the moire preventing part has a polygonal planar shape.

[10] An electromagnetic shielding film according to the first aspect of the present invention, wherein the moire preventing part has an at least partially curved planer shape.

[11] An electromagnetic shielding film according to the first aspect of the present invention, comprising a transparent support and a mesh pattern of a conductive metal thin film formed thereon, wherein the conductive metal thin film has the conductive portion and the opening portion, and the moire preventing part is formed in the opening portion.

[12] An electromagnetic shielding film according to the first aspect of the present invention, wherein the conductive metal thin film has a metallic silver portion formed by exposing and developing a photosensitive silver salt layer on the transparent support.

[13] An electromagnetic shielding film according to the first aspect of the present invention, wherein the metallic silver portion contains developed silver generated by developing a silver halide.

[14] An electromagnetic shielding film according to the first aspect of the present invention, wherein the conductive metal thin film has a first conductive layer and a second conductive layer, the first conductive layer is a metallic silver portion formed by exposing and developing a photosensitive silver salt layer on the transparent support, and the second conductive layer is formed by disposing a conductive metal on said metallic silver portion.

[15] An electromagnetic shielding film according to the first aspect of the present invention, wherein the photosensitive silver salt layer is exposed using a mask, and the mask has a mask pattern corresponding to the mesh pattern and a pattern of the moire preventing part in the opening portion.

[16] An electromagnetic shielding film according to the first aspect of the present invention, wherein the photosensitive silver salt layer is exposed using digital writing corresponding to the mesh pattern and a pattern of the moire preventing part in the opening portion.

[17] An electromagnetic shielding film according to the first aspect of the present invention, wherein the mesh pattern and the moire preventing part are formed by the steps of forming a photoresist film on a copper foil formed on the transparent support, exposing and developing the photoresist film to form a resist pattern, and etching the copper foil uncovered by the resist pattern.

[18] An electromagnetic shielding film according to the first aspect of the present invention, wherein the photoresist film is exposed using a mask, and the mask has a mask pattern corresponding to the mesh pattern and a pattern of the moire preventing part in the opening portion.

[19] An electromagnetic shielding film according to the first aspect of the present invention, wherein the photoresist film is exposed using digital writing corresponding to the mesh pattern and a pattern of the moire preventing part in the opening portion.

[20] An electromagnetic shielding film according to the first aspect of the present invention, wherein the mesh pattern of the conductive metal thin film is formed by printing a paste on the transparent support. The paste may be a conductive paste or a paste containing a catalyst such as fine metal particles. Thus, the conductive metal thin film may contain only the conductive paste, the catalyst and a plating layer, or the conductive paste and a plating layer.

[21] An electromagnetic shielding film according to the first aspect of the present invention, wherein the conductive metal thin film has a first conductive layer and a second conductive layer, the first conductive layer is the mesh pattern formed by printing a paste on the transparent support, and the second conductive layer is a metal plating layer formed by plating the mesh pattern with a metal.

[22] An electromagnetic shielding film according to the first aspect of the present invention, wherein the mesh pattern and a pattern of the moire preventing part in the opening portion are formed on the transparent support by a screen printing plate or a gravure printing plate.

[23] An electromagnetic shielding film according to the first aspect of the present invention, comprising a tacky material layer.

[24] An electromagnetic shielding film according to the first aspect of the present invention, comprising a peelable protective film.

[25] An electromagnetic shielding film according to the first aspect of the present invention, comprising a transparent functional layer having at least one function selected from infrared shielding functions, hard coating functions, antireflection functions, antiglare functions, antistatic functions, antifouling functions, ultraviolet cutoff functions, gas barrier functions, and display panel breakage prevention functions.

[26] An electromagnetic shielding film according to the first aspect of the present invention, having an infrared shielding function.

[27] An optical filter according to a second aspect of the present invention, comprising a light transmittable, electromagnetic shielding film according to the first aspect of the present invention.

As described above, the electromagnetic shielding film and the optical filter of the present invention are excellent in the electromagnetic shielding property and light transmittance, and capable of minimizing image quality deterioration due to the moire or the like.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

An embodiment of the electromagnetic shielding film and the optical filter of the present invention will be described below with reference to FIGS. 1 to 10.

Figure 1:
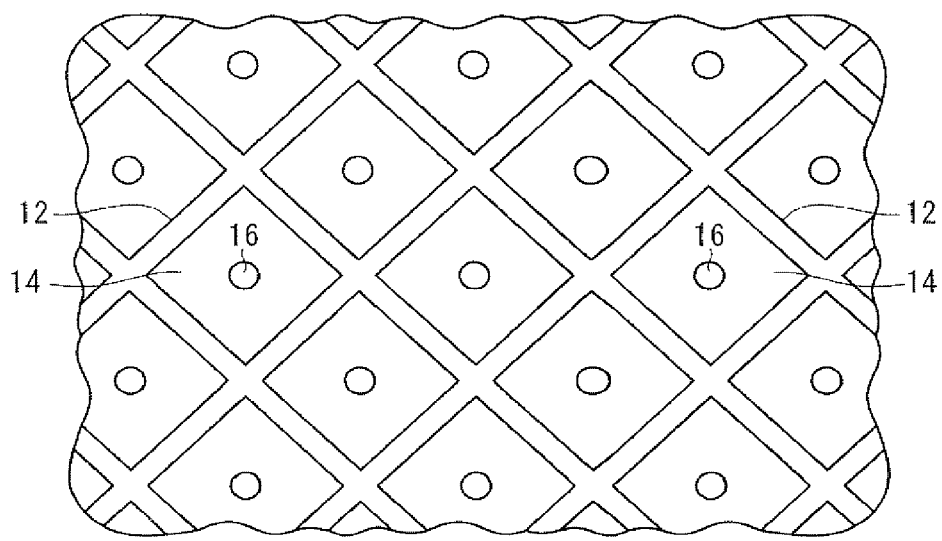
FIG. 1 is a plan view partially showing an electromagnetic shielding film according to an embodiment of the present invention.

As shown in FIG. 1, an electromagnetic shielding film 10 according to the embodiment has conductive portions 12 and opening portions 14, and moire preventing parts 16 are formed in the opening portions 14.

Figure 2A:
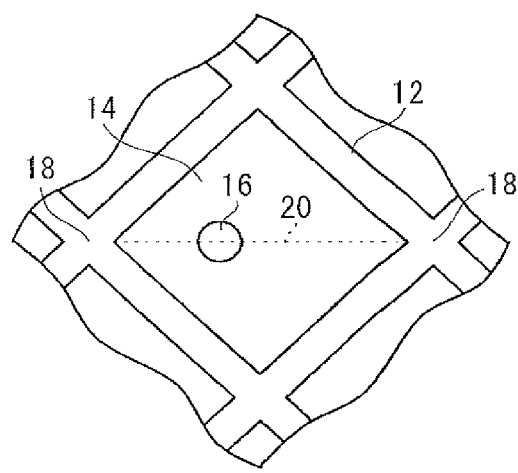
FIGS. 2A and 2B are plan views each partially showing an example of the position of a moire preventing part in an opening portion of a mesh pattern.

When the conductive portions 12 and the opening portions 14 are combined into a mesh pattern, as shown in FIG. 1, each moire preventing part 16 may be formed approximately at the center of the opening portion 14. Alternatively, as shown in FIG. 2A, the moire preventing part 16 may be formed on a line 20 connecting intersections 18 facing each other of the conductive portions 12 in the mesh pattern.

Figure 2B:
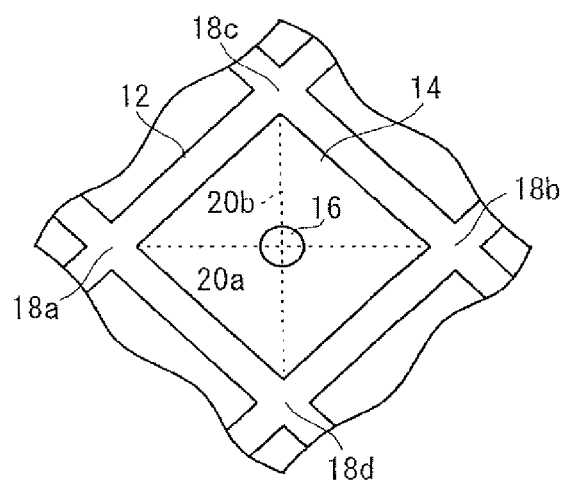

Further, as shown in FIG. 2B, four intersections (a first intersection 18a and a second intersection 18b facing each other, and a third intersection 18c and a fourth intersection 18d facing each other) may be formed around the opening portion 14, and the moire preventing part 16 may be formed at the intersection point of a first line 20a connecting the first intersection 18a and the second intersection 18b and a second line 20b connecting the third intersection 18c and the fourth intersection 18d.

Figure 3A:
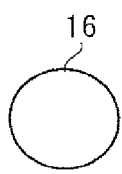
FIGS. 3A to FIG. 3G are plan views each showing an example of the planar shape of the moire preventing part.
Figure 3B:
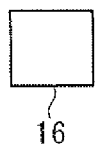
Figure 3C:
Figure 3D:
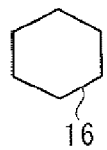
Figure 3E:
Figure 3F:
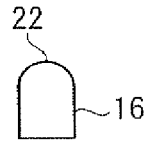
Figure 3G:
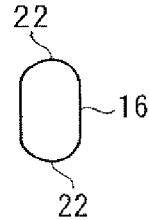

The planar shape of the moire preventing part 16 may be a substantially circular shape as shown in FIG. 3A or a polygonal shape (such as a quadrangular, pentagonal, hexagonal, or octagonal shape) as shown in FIGS. 3B to 3E. Of course the planar shape of the moire preventing part 16 may contain at least one curved portion 22 as shown in FIGS. 3F and 3G.

When Sa represents the area of the intersection 18 of the conductive portions 12 and Sb represents the area of the moire preventing part 16, Sa and Sb preferably satisfy $0.1Sa \leq Sb \leq 5.0Sa$. Further, Sa and Sb more preferably satisfy $0.1Sa \leq Sb \leq 1.9Sa$, further more preferably satisfy $0.5Sa \leq Sb \leq 1.5Sa$, most preferably satisfy $0.9Sa \leq Sb \leq 1.1Sa$.

Figure 4A:
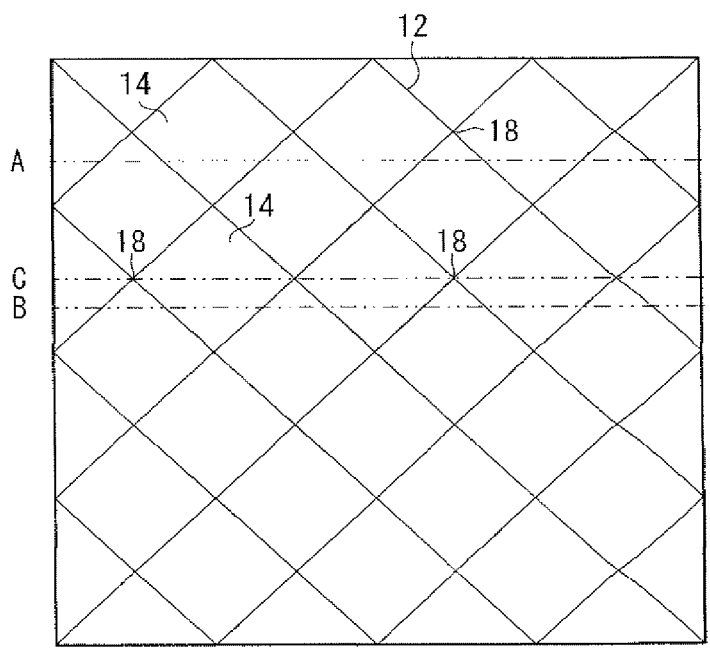
FIG. 4A is a plan view partially showing an electromagnetic shielding film not having moire preventing parts in opening portions.
Figure 4B:
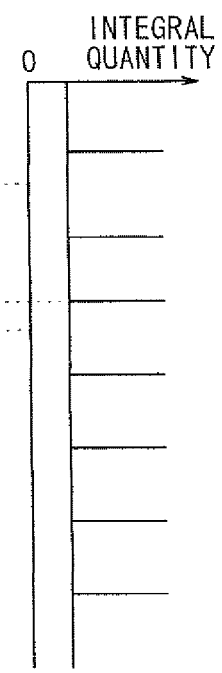
FIG. 4B is a characteristic chart showing the integral quantity of a light transmitted through the film.

In the case of not forming the moire preventing parts 16 in the opening portions 14 as shown in FIG. 4A, the integral quantity of a light transmitted through the opening portions 14 is distributed as shown in FIG. 4B when projected onto one side of the film. In positions other than the intersections 18, for example, positions shown by virtual lines A and B, the conductive portions 12 are distributed at the same ratio, so that the integral quantity is approximately uniform. In a position having the intersections 18 shown by a virtual line C, two conductive portions 12 are united into one, so that the integral quantity of the transmitted light is increased. Such positions, in which the integral quantity is increased, are disposed in line with a spatial frequency according to the arrangement of the intersections 18.

When an optical filter containing an electromagnetic shielding film having such a property is used in a PDP or the like, moire is generated due to the spatial frequency difference between PDP pixels and the above positions with increased integral quantity (of the transmitted light).

Figure 5A:
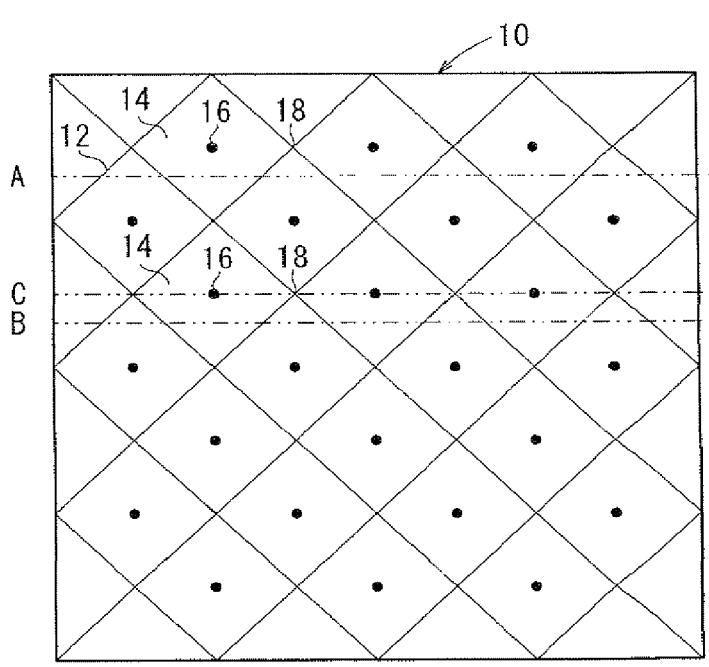
FIG. 5A is a plan view partially showing the electromagnetic shielding film having the moire preventing parts in the opening portions.
Figure 5B:
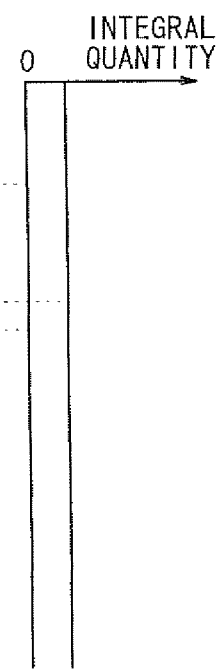
FIG. 5B is a characteristic chart showing the integral quantity of a light transmitted through the film.

In contrast, in this embodiment, the moire preventing parts 16 are formed in the opening portions 14 of the electromagnetic shielding film 10 as shown in FIGS. 1 and 5A, so that the integral quantity of the transmitted light is not locally increased and is approximately uniform over the entire film 10 as shown in FIG. 5B. Thus, the moire is hardly generated as if the mesh pattern of the conductive portions 12 and the opening portions 14 is not present.

Therefore, the electromagnetic shielding film 10 of this embodiment is excellent in both the electromagnetic shielding property and light transmittance, and capable of minimizing image quality deterioration due to the moire or the like.

Figure 6:
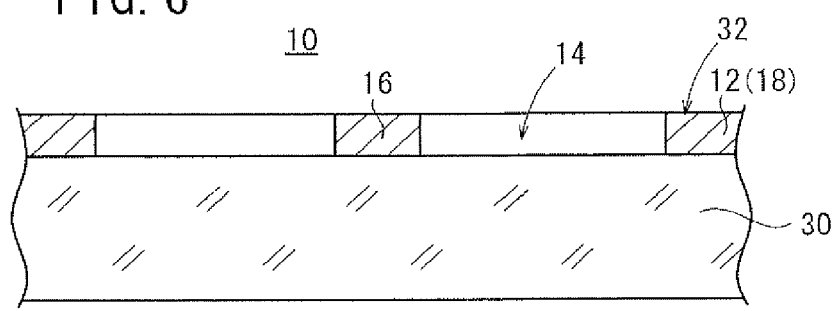
FIG. 6 is a cross-sectional view partially showing the electromagnetic shielding film according to the embodiment.

As shown in FIG. 6, the electromagnetic shielding film 10 of this embodiment may have a specific structure containing a transparent support 30 and a mesh-patterned conductive metal thin film (hereinafter referred to as the mesh pattern 32) formed thereon. The moire preventing parts 16 are formed in the opening portions 14 of the mesh pattern 32.

In the electromagnetic shielding film 10 of this embodiment, the mesh pattern 32 may be formed by exposing, developing, and fixing a photosensitive silver salt layer on the transparent support 30 to form a metallic silver portion, and by disposing a conductive metal on the metallic silver portion.

Figure 7A:
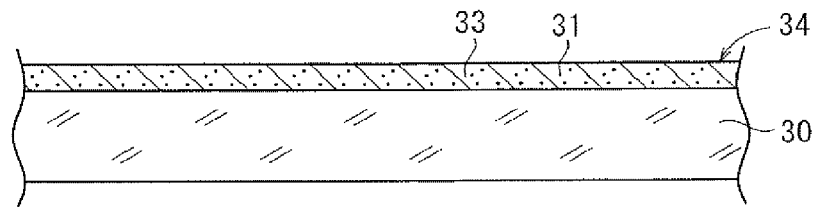
FIGS. 7A to 7E are views showing the process of a method for producing the electromagnetic shielding film according to the embodiment.

Specifically, as shown in FIG. 7A, the transparent support 30 is coated with a photosensitive silver salt layer 34, which is formed by mixing a silver halide 31 (e.g., silver bromide particles, silver chlorobromide particles, silver iodobromide particles) with a gelatin 33. Though the silver halide 31 is exaggeratingly shown as particles in 7A to 7C to facilitate understanding, the size, concentration, etc. of the silver halide 31 are not limited to the drawings.

Figure 7B:
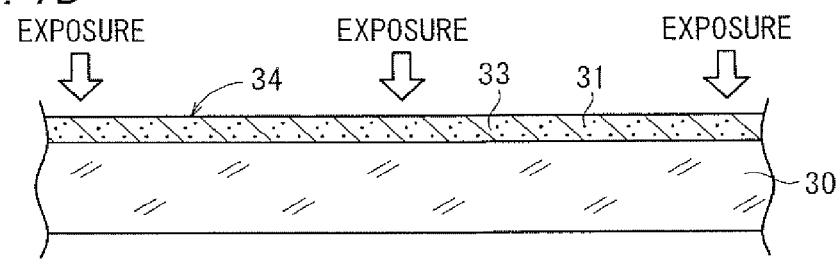

Then, as shown in FIG. 7B, the photosensitive silver salt layer 34 is subjected to an exposure treatment for forming the mesh pattern 32. When an optical energy is applied to the silver halide 31, a minute silver nucleus (a latent image), invisible to the naked eye, is generated.

Figure 7C:
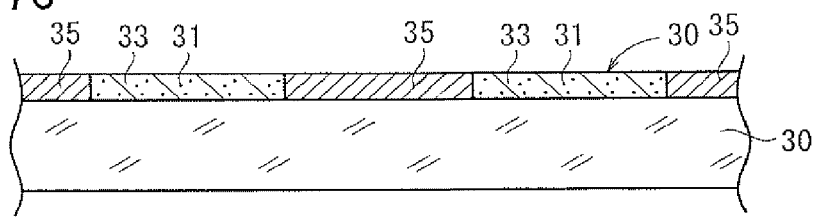

As shown in FIG. 7C, a development treatment is carried out to convert the latent image to an image visible to the naked eye. Specifically, the photosensitive silver salt layer 34 having the latent image is developed using a developer, which is an alkaline or acidic solution, generally an alkaline solution. In the development treatment, using the latent image silver nucleus as a catalyst core, a silver ion from the silver halide particles or the developer is reduced to metallic silver by a reducing agent, called a developing agent, in the developer. As a result, the latent image silver nucleus is grown to form a visible silver image (a developed silver 35).

Figure 7D:
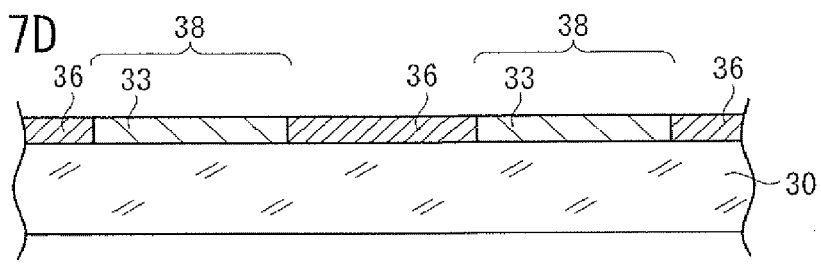

The photosensitive silver halide 31 remains in the photosensitive silver salt layer 34 after the development treatment. As shown in FIG. 7D, the silver halide 31 is removed by a fixation treatment using a fixer, which is an acidic or alkaline solution, generally an acidic solution.

After the fixation treatment, the metallic silver portion 36 is disposed in an exposed area, and only the gelatin 33 remains in an unexposed area as a light transmittable portion 38. Thus, the combination of the metallic silver portion 36 and the light transmittable portion 38 is formed on the transparent support 30.

In a case where silver bromide is used as the silver halide 31 and a thiosulfate salt is used in the fixation treatment, a reaction represented by the following formula proceeds in the fixation treatment.

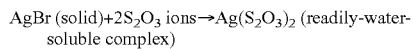

AgBr (solid)+2S$_2$O$_3$ ions→Ag(S$_2$O$_3$)$_2$ (readily-water-soluble complex)

Two thiosulfate S$_2$O$_3$ ions and a silver ion in the gelatin 33 (a silver ion from AgBr) are reacted to generate a silver thiosulfate complex. The silver thiosulfate complex has high water solubility, and thereby is eluted from the gelatin 33. As a result, the developed silver 35 is fixed as the metallic silver portion 36.

Thus, the latent image is reacted with the reducing agent to deposit the developed silver 35 in the development step, and the residual silver halide 31, not converted to the developed silver 35, is eluted into water in the fixation step. The steps are described in detail in T. H. James, "The Theory of the Photographic Process, 4th ed.", Macmillian Publishing Co., Inc., NY, Chapter 15, pp. 438-442, 1977.

An alkaline solution is generally used in the development treatment. Therefore, the alkaline solution used in the development treatment may be mixed into the fixer (generally an acidic solution) for the fixation treatment, whereby the activity of the fixer may be disadvantageously changed. Further, the developer may remain on the film taken out of the development bath, whereby an undesired development reaction may further progress. Thus, it is preferred that the photosensitive silver salt layer 34 is neutralized or acidified by a quencher such as an acetic acid solution after the development treatment and before the fixation treatment.

Figure 7E:
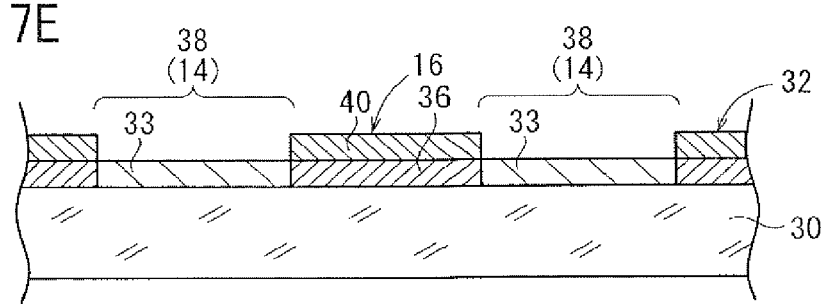

Then, for example, as shown in FIG. 7E, a conductive metal 40 is deposited only on the metallic silver portion 36 by a plating treatment (an electroless plating treatment, an electroplating treatment, or a combination thereof). Thus, the mesh pattern 32 containing the metallic silver portion 36 and the conductive metal 40 supported thereon is formed on the transparent support 30.

The difference between the above mentioned method using the photosensitive silver salt layer 34 (a silver salt photography technology) and a method using a photoresist (a resist technology) will be described below.

In the resist technology, a photopolymerization initiator absorbs a light in an exposure treatment to initiate a reaction, a photoresist film (a resin) per se undergoes a polymerization reaction to increase or decrease solubility in a developer, and the resin in an exposed area or an unexposed area is removed in a development treatment. The developer used in the resist technology may be an alkaline solution free of reducing agents, in which an unreacted resin component can be dissolved. On the other hand, as described above, in the silver salt photography technology according to the present invention, the minute silver nucleus, the so-called latent image, is formed from silver ion and photoelectron generated in the exposed silver halide 31 in the exposure treatment. The latent image silver nucleus is grown to form the visible silver image in the development treatment using the developer, which must contain the reducing agent (the developing agent). Thus, the resist technology and the silver salt photography technology are greatly different in the reactions in the exposure and development treatments.

In the development treatment of the resist technology, the unpolymerized resin portion in the exposed or unexposed area is removed. On the other hand, in the development treatment of the silver salt photography technology, using the latent image as the catalyst core, the reduction reaction is conducted by the reducing agent (the developing agent) contained in the developer, and the developed silver 35 is grown into a visible size. The gelatin 33 in the unexposed area is not removed in the silver salt photography technology. Thus, the resist technology and the silver salt photography technology are greatly different also in the reactions in the development treatments.

The silver halide 31 contained in the gelatin 33 in the unexposed area is eluted in the following fixation treatment, and the gelatin 33 itself is not removed.

As described above, the main reaction component (the photosensitive component) is the silver halide in the silver salt photography technology, while it is the photopolymerization initiator in the resist technology. Further, in the development treatment, the binder (the gelatin 33) remains in the silver salt photography technology, while it is removed in the resist technology. The resist technology and the silver salt photography technology are greatly different in these points.

The photosensitive silver salt layer 34 may be exposed using a mask having a mask pattern corresponding to the mesh pattern 32 and a pattern of the moire preventing parts 16 in the opening portions 14.

Alternatively, the photosensitive silver salt layer 34 may be exposed using digital writing corresponding to the mesh pattern 32 and the pattern of the moire preventing parts 16 in the opening portions 14.

Figure 8A:
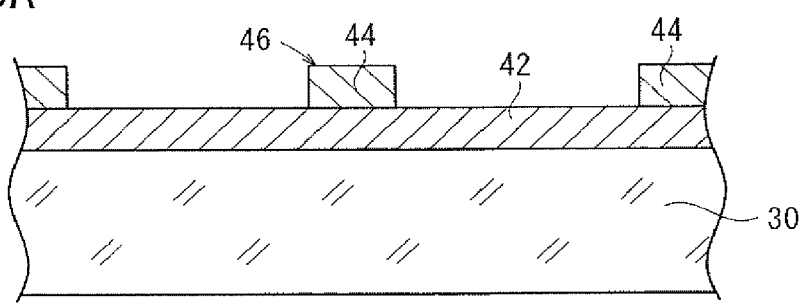
FIGS. 8A and 8B are views showing the process of another method for producing the electromagnetic shielding film according to the embodiment.
Figure 8B:
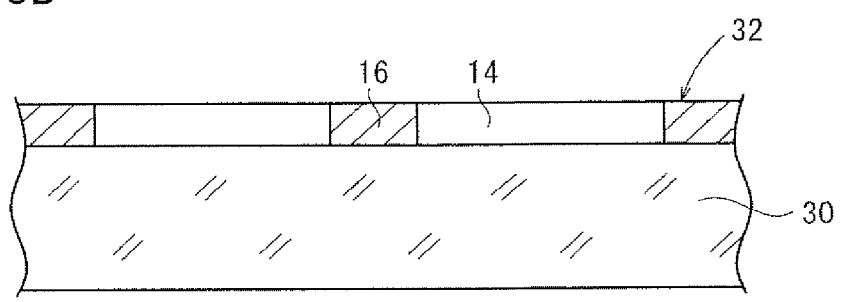

The mesh pattern 32 and the pattern of the moire preventing parts 16 in the opening portions 14 may be formed by another method such that a photoresist film 44 is formed on a copper foil 42 disposed on the transparent support 30, and exposed and developed to form a resist pattern 46 as shown in FIG. 8A, and the copper foil 42 exposed from the resist pattern 46 is etched as shown in FIG. 8B. In this method, the photoresist film 44 may be exposed using a mask having a mask pattern corresponding to the mesh pattern 32 and the pattern of the moire preventing parts 16.

Alternatively, the photoresist film 44 may be exposed using digital writing corresponding to the mesh pattern 32 and the pattern of the moire preventing parts 16.

Figure 9A:
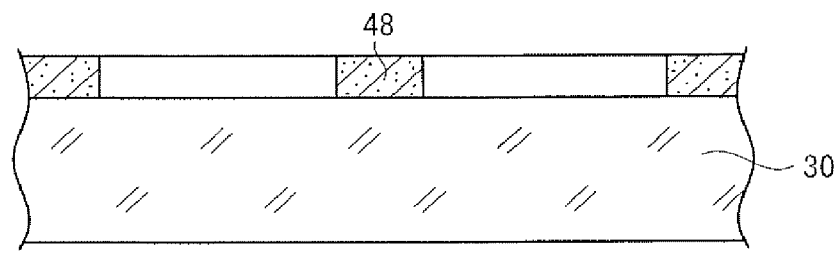
FIGS. 9A and 9B are views showing the process of a further method for producing the electromagnetic shielding film according to the embodiment.
Figure 9B:
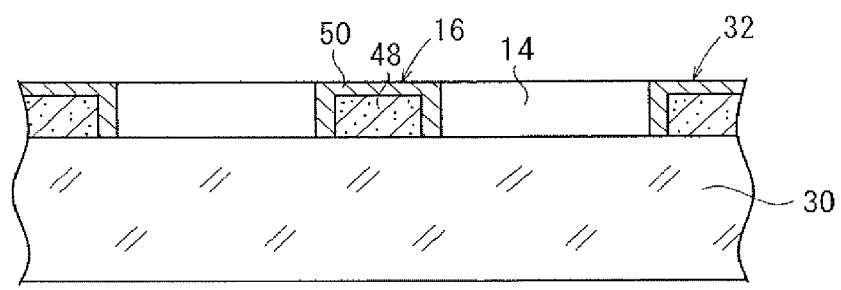

Further, the mesh pattern 32 and the pattern of the moire preventing parts 16 in the opening portions 14 may be formed by printing a paste 48 containing fine metal particles on the transparent support 30 as shown in FIG. 9A, and by plating the paste 48 with a metal to form a metal plating layer 50 as shown in FIG. 9B.

Figure 10:
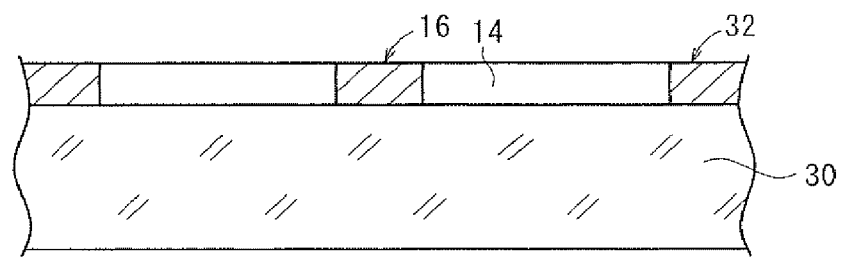
FIG. 10 is a view showing the process of a still further method for producing the electromagnetic shielding film according to the embodiment.

Furthermore, the mesh pattern 32 and the pattern of the moire preventing parts 16 in the opening portions 14 may be printed onto the transparent support 30 using a screen printing plate or a gravure printing plate as shown in FIG. 10.

The method for producing the electromagnetic shielding film 10 of this embodiment, particularly a preferred method using a photographic photosensitive silver halide material for forming the conductive metal thin film will be described in detail below.

As described above, the conductive shielding film 10 of the embodiment may be produced such that a photosensitive material having the transparent support 30 and a photosensitive silver halide emulsion layer formed thereon is exposed and developed, whereby the metallic silver portion 36 and the light transmittable portion 38 are formed in the exposed area and the unexposed area respectively, and the metallic silver portion 36 is subjected to a physical development and/or a plating treatment to deposit the conductive metal 40 thereon.

Specific examples of methods for forming the conductive shielding film 10 include the following three processes, different in the photosensitive materials and development treatments.

(1) A process comprising subjecting a photosensitive black-and-white silver halide material free of physical development nucleus to a chemical or thermal development, to form the metallic silver portion 36 on the photosensitive material.

(2) A process comprising subjecting a photosensitive black-and-white silver halide material having a silver halide emulsion layer containing physical development nuclei to a solution physical development, to form the metallic silver portion 36 on the photosensitive material.

(3) A process comprising subjecting a stack of a photosensitive black-and-white silver halide material free of physical development nucleus and an image-receiving sheet having a non-photosensitive layer containing physical development nuclei to a diffusion transfer development, so as to form the metallic silver portion 36 on the non-photosensitive, image-receiving sheet.

The process of (1) is an integral black-and-white development-type method capable of forming the electromagnetic shielding film, a light transmittable conductive film, or the like on the photosensitive material. The resulting developed silver is a chemically or thermally developed silver having a structure of high-specific surface area filament, and shows a high activity in the following plating treatment or physical development.

In the process of (2), silver halide particles are melted around the physical development nuclei and deposited on the nuclei in an exposed area, so as to form the light transmittable electromagnetic shielding film, the light transmittable conductive film, or the like on the photosensitive material. Also the process of (2) is an integral black-and-white development-type method. Though high activity can be achieved since the silver halide is deposited on the physical development nuclei in the development, the developed silver has a spherical shape with small specific surface.

In the process of (3), silver halide particles are melted in an unexposed area, and diffused and deposited on the development nuclei of the image-receiving sheet, to form the electromagnetic shielding film, the light transmittable conductive film, or the like on the image-receiving sheet. The process of (3) is a so-called separate-type method, and the image-receiving sheet is peeled from the photosensitive material.

A negative development treatment or a reversal development treatment can be used in these processes. In the diffusion transfer development, the negative development treatment can be carried out using an auto-positive material as the photosensitive material.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Processes*, 4th ed.", Macmillian, 1977. In addition to the liquid development treatment, also a thermal development can be utilized in the invention. For example, techniques described in Japanese Laid-Open Patent Publication Nos. 2004-184693, 2004-334077, and 2005-010752, and Japanese Patent Application Nos. 2004-244080 and 2004-085655 may be used.

(Photosensitive Material)

[Transparent Support]

The transparent support of the photosensitive material used in the producing method according to this embodiment may be a plastic film, a plastic plate, a glass plate, etc.

Examples of materials for the plastic film and plastic plate include polyesters such as polyethylene terephthalates (PET) and polyethylene naphthalates; polyolefins such as polyethylenes (PE), polypropylenes (PP), polystyrenes, and EVA; vinyl resins such as polyvinyl chlorides and polyvinylidene chlorides; polyether ether ketones (PEEK); polysulfones (PSF); polyether sulfones (PES); polycarbonates (PC); polyamides; polyimides; acrylic resins; and triacetyl celluloses (TAC).

In this embodiment, it is preferred that the plastic film is a polyethylene terephthalate film or a triacetyl cellulose film from the viewpoints of light transmittance, heat resistance, handling, and cost.

In the case of using the electromagnetic shielding material for a display device, the material have to be light transmittable, and thus the support preferably has a high light transmittance. In this case, the total visible light transmittance of the plastic film or plate is preferably 70% to 100%, more preferably 85% to 100%, particularly preferably 90% to 100%. The plastic film and plate may be colored as long as they do not interfere with the advantageous effects of the present invention.

In this embodiment, the plastic film and plate may have a monolayer structure or a multilayer structure containing two or more layers.

[Protective Layer]

The photosensitive material may have a protective layer formed on an emulsion layer to be hereinafter described. The protective layer used in this embodiment comprises a binder such as a gelatin or high-molecular polymer, and is formed on a photosensitive emulsion layer to improve the scratch prevention or mechanical property. It is preferred that the protective layer is not formed in view of the plating treatment. When the protective layer is formed, it preferably has a smaller thickness. The thickness of the protective layer is preferably 0.2 μm or less. The protective layer may be formed by an appropriate known coating method though not particularly restricted.

[Emulsion Layer]

The photosensitive material for the producing method of this embodiment preferably has the emulsion layer containing a silver salt as a light sensor (a silver salt-containing layer) on the transparent support 30. The emulsion layer may contain a dye, a binder, a solvent, etc. if necessary, in addition to the silver salt.

<Dye>

The photosensitive material may contain a dye in at least the emulsion layer. The dye is contained in the emulsion layer as a filter dye or for a purpose of irradiation prevention, etc. The dye may be a solid dispersion dye. Preferred examples of the dyes useful in this embodiment include dyes represented by the general formulae (FA), (FA1), (FA2), and (FA3) of Japanese Laid-Open Patent Publication No. 9-179243, specifically the compounds F1 to F34 of this patent publication. The preferred examples further include (II-2) to (II-24), (III-5) to (III-18), and (IV-2) to (IV-7) described in Japanese Laid-Open Patent Publication No. 7-152112.

The dye may be decolored in the solid fine particle dispersion state in a development or fixation treatment. Examples of such dyes include cyanine dyes, pyrylium dyes, and aminium dyes described in Japanese Laid-Open Patent Publication No. 3-138640. Examples of dyes not decolored in the treatment include cyanine dyes having a carboxyl group described in Japanese Laid-Open Patent Publication No. 9-96891; cyanine dyes having no acidic groups described in Japanese Laid-Open Patent Publication No. 8-245902; lake cyanine dyes described in Japanese Laid-Open Patent Publication No. 8-333519; cyanine dyes described in Japanese Laid-Open Patent Publication No. 1-266536; holopolar cyanine dyes described in Japanese Laid-Open Patent Publication No. 3-136038; pyrylium dyes described in Japanese Laid-Open Patent Publication No. 62-299959; polymer cyanine dyes described in Japanese Laid-Open Patent Publication No. 7-253639; solid fine particle dispersions of oxonol dyes described in Japanese Laid-Open Patent Publication No. 2-282244; light scattering particles described in Japanese Laid-Open Patent Publication No. 63-131135; $Yb^{3+}$ compounds described in Japanese Laid-Open Patent Publication No. 9-5913; and ITO powders described in Japanese Laid-Open Patent Publication No. 7-113072. Further, dyes represented by the general formulae (F1) and (F2) of Japanese Laid-Open Patent Publication No. 9-179243, specifically the compounds F35 to F112, may be used in the present invention.

The above dye may be a water-soluble dye, and examples thereof include oxonol dyes, benzylidene dyes, merocyanine dyes, cyanine dyes, and azo dyes. Among them, oxonol dyes, hemioxonol dyes, and benzylidene dyes are effective in the present invention. Specific examples of the water-soluble dyes useful in the present invention include dyes described in UK Patent Nos. 584,609 and 1,177,429; Japanese Laid-Open Patent Publication Nos. 48-85130, 49-99620, 49-114420, 52-20822, 59-154439, and 59-208548; and U.S. Pat. Nos. 2,274,782, 2,533,472, 2,956,879, 3,148,187, 3,177,078, 3,247,127, 3,540,887, 3,575,704, 3,653,905, and 3,718,427.

The mass ratio of the dye to the solid contents in the emulsion layer is preferably 0.01% to 10% by mass, more preferably 0.1% to 5% by mass, in view of the effects such as the irradiation prevention effect and the sensitivity reduction due to the excessively large amount added.

<Silver Salt>

The silver salt used in the embodiment is preferably an inorganic silver salt such as a silver halide, and is particularly preferably used in the state of silver halide particles for a photographic photosensitive silver halide material. The silver halide is excellent in light sensing property.

The silver halide, preferably used in the state of a photographic emulsion of the photographic photosensitive silver halide material, will be described below.

In this embodiment, the silver halide is preferably used as a light sensor. Technologies for photographic silver salt films, photographic papers, print engraving films, emulsion masks for photomasking, and the like, using the silver halide, may be utilized in the embodiment.

The silver halide may contain a halogen element of chlorine, bromine, iodine, or fluorine, and may contain a combination of the elements. For example, the silver halide preferably contains AgCl, AgBr, or AgI, and more preferably contains AgBr or AgCl, as a main component. Also silver chlorobromide, silver iodochlorobromide, and silver iodobromide may be preferably used as the silver halide. The silver halide is further preferably silver chlorobromide, silver bromide, silver iodochlorobromide, or silver iodobromide, most preferably silver chlorobromide or silver iodochlorobromide having a silver chloride content of 50 mol % or more.

The term "the silver halide contains AgBr (silver bromide) as a main component" means that the mole ratio of bromide ion is 50% or more in the silver halide composition. The silver halide containing AgBr as a main component may contain iodide or chloride ion in addition to the bromide ion.

The silver halide is in the state of solid particles. The average particle size of the silver halide particles is preferably 0.1 to 1000 nm (1 μm), more preferably 0.1 to 100 nm, further preferably 1 to 50 nm, in spherical equivalent diameter, in view of the image quality of a patterned metallic silver layer formed after the exposure and development treatments.

The spherical equivalent diameter of the silver halide particle means a diameter of a spherical particle having the same volume as the silver halide particle.

The shape of the silver halide particle is not particularly limited, and may be a spherical shape, a cubic shape, a tabular shape (such as a tabular hexagonal shape, a tabular triangular shape, or a tabular quadrangular shape), an octahedron shape, a tetradecahedron shape, etc. The silver halide particle preferably has a cubic shape or a tetradecahedron shape.

The inside and the surface of the silver halide particle may comprise the same or different phases. Further, the silver halide particle may have a localized layer having a different halogen composition inside or on the surface.

A silver halide emulsion, used as a coating liquid for the emulsion layer in this embodiment, may be prepared by a method described in P. Glafkides, "*Chimie et Physique Photographique*", PaulMontel, 1967, G. F. Dufin, "*Photographic Emulsion Chemistry*", The Forcal Press, 1966, V. L. Zelikman, et al., "*Making and Coating Photographic Emulsion*", The ForcalPress, 1964, etc.

Thus, the silver halide emulsion may be prepared by an acidic process or a neutral process. Further, a soluble silver salt and a soluble halogen salt may be reacted by using a one-side mixing process, a simultaneous mixing process, or a combination thereof.

The silver particles may be formed in the presence of excess silver ions by a so-called reverse mixing process. Further, the formation may be achieved by using a so-called controlled double jet method, one of the simultaneous mixing processes containing maintaining a constant pAg in a liquid phase for producing the silver halide.

It is also preferred that the silver particles are formed using a so-called silver halide solvent such as ammonia, a thioether, or a tetrasubstituted thiourea. The solvent is more preferably a tetrasubstituted thiourea compound described in Japanese Laid-Open Patent Publication Nos. 53-82408 and 55-77737. Preferred thiourea compounds include tetramethylthiourea and 1,3-dimethyl-2-imidazolidinethione. The amount of the silver halide solvent is preferably $10^{-5}$ to $10^{-2}$ mol per 1 mol of the silver halide, though the amount may be changed depending on the types of compounds used, the desired particle size, and the desired halogen composition.

The controlled double jet method and the particle forming method using the silver halide solvent are preferred in this embodiment because a silver halide emulsion having a regular crystal shape and a narrow particle size distribution can be easily prepared by using the methods.

It is preferred that the silver particles are rapidly grown within a range of the critical saturation degree in order to obtain a uniform particle size by using a method of changing the addition rate of silver nitrate or an alkali halide according to particle growth rate as described in UK Patent No. 1,535,016, and Japanese Patent Publication Nos. 48-36890 and 52-16364, or a method of changing the concentration of an aqueous solution as described in UK Patent No. 4,242,445 and Japanese Laid-Open Patent Publication No. 55-158124. The silver halide emulsion used for forming the emulsion layer in this embodiment is preferably a monodisperse emulsion, and the variation coefficient thereof, obtained by {(Standard deviation of particle size)/(Average particle size)}×100, is preferably 20% or less, more preferably 15% or less, most preferably 10% or less.

The silver halide emulsion used in this embodiment may be a mixture of a plurality of emulsions having different particle sizes.

The silver halide emulsion used in the embodiment may contain a metal of Group VIII or VIIB. It is particularly preferred that the silver halide emulsion contains a rhodium compound, an iridium compound, a ruthenium compound, an iron compound, an osmium compound, or the like to achieve high contrast and low fogging. Those compounds may have various ligands, and examples of the ligands include cyanide ions, halogen ions, thiocyanate ions, nitrosyl ions, water, hydroxide ions, pseudohalogens, ammonia, and organic molecules such as amines (methylamine, ethylenediamine, etc.), heterocyclic compounds (imidazole, thiazole, 5-methylthiazole, mercaptoimidazole, etc.), urea, and thiourea.

The silver halide emulsion may be effectively doped with a hexacyano-metal complex such as $K_4[Fe(CN)_6]$, $K_4[Ru(CN)_6]$, or $K_3[Cr(CN)_6]$ for increasing sensitivity.

The rhodium compound may be a water-soluble rhodium compound. Examples of the water-soluble rhodium compounds include halogenated rhodium (III) compounds, hexachloro-rhodium (III) complex salts, pentachloro-aquo-rhodium complex salts, tetrachloro-diaquo-rhodium complex salts, hexabromo-rhodium (III) complex salts, hexamine-rhodium (III) complex salts, trioxalato rhodium (III) complex salts, and $K_3Rh_2Br_9$.

The rhodium compound is used in the state of a solution of water or an appropriate solvent. The rhodium compound solution may be stabilized by a common method of adding an aqueous hydrogen halide solution (such as hydrochloric acid, hydrobromic acid, or hydrofluoric acid) or an alkali halide (such as KCl, NaCl, KBr, or NaBr). Instead of using the water-soluble rhodium compound, another silver halide particles, which are doped with rhodium beforehand, may be added to and dissolved in the mixture for preparing the silver halide.

Examples of the iridium compounds include hexachloro-iridium complex salts such as $K_2IrCl_6$ and $K_3IrCl_6$, hexabromo-iridium complex salts, hexamine-iridium complex salts, and pentachloro-nitrosyl-iridium complex salts.

Examples of the ruthenium compounds include hexachlororuthenium, pentachloronitrosylruthenium, and $K_4[Ru(CN)_6]$.

Examples of the iron compounds include potassium hexacyanoferrate (II) and ferrous thiocyanate.

Ruthenium and osmium mentioned above are added in the state of a water-soluble complex salt described in Japanese Laid-Open Patent Publication Nos. 63-2042, 1-285941, 2-20852, and 2-20855, etc. The water-soluble complex salt is particularly preferably a six-coordinate complex represented by the formula $[ML_6]^{-n}$.

In the formula, M represents Ru or Os, n represents 0, 1, 2, 3, or 4, and L represents a ligand (or a counter ion).

L is not important, and may be an ammonium or alkali metal ion. Preferred ligands include halide ligands, cyanide ligands, cyanoxide ligands, nitrosyl ligands, and thionitrosyl ligands. Specific examples of such complexes for the present invention are illustrated below without intention of restricting the scope of the invention.

$[RuCl_6]^{-3}$, $[RuCl_4(H_2O)_2]^{-1}$, $[RuCl_5(NO)]^{-2}$. $[RuBr_5(NS)]^{-2}$, $[Ru(CO)_3Cl_3]^{-2}$, $[Ru(CO)Cl_5]^{-2}$, $[Ru(CO)Br_5]^{-2}$, $[OsCl_6]^{-3}$, $[OsCl_5(NO)]^{-2}$, $[Os(NO)(CN)_5]^{-2}$, $[OS(NS)Br_5]^{-2}$, $[Os(CN)_6]^{-4}$, $[OS(O)_2(CN)_5]^{-4}$.

The amount of the compound added per 1 mol of the silver halide is preferably $10^{-10}$ to $10^{-2}$ mol/mol Ag, more preferably $10^{-9}$ to $10^{-3}$ mol/mol Ag.

Further, in this embodiment, the silver halide may preferably contain Pd (II) ion and/or Pd metal. Pd is preferably contained near the surface of the silver halide particle though it may be uniformly distributed therein. The term "Pd is contained near the surface of the silver halide particle" means that the particle has a layer with a higher palladium content in a region of 50 nm or less in the depth direction from the surface.

Such silver halide particles can be prepared by adding Pd during the particle formation. Pd is preferably added after the silver ion and halogen ion are added by 50% or more of the total amounts respectively. Further, it is also preferred that the Pd (II) ion is added in an after-ripening step to obtain the silver halide particle containing Pd near the surface.

The Pd-containing silver halide particle acts to accelerate the physical development and electroless plating, improve production efficiency of a desired electromagnetic shielding material, and lower the production cost. Although Pd is well known as an electroless plating catalyst, in the present invention, Pd can be located near the surface of the silver halide particle, so that the remarkably expensive Pd can be saved.

In this embodiment, the content of the Pd ion and/or Pd metal per 1 mol of silver in the silver halide is preferably $10^{-4}$ to 0.5 mol/mol Ag, more preferably 0.01 to 0.3 mol/mol Ag.

Examples of Pd compounds useful for the silver halide include $PdCl_4$ and $Na_2PdCl_4$.

In this embodiment, the sensitivity as the light sensor can be improved by chemical sensitization, which is generally used for photographic emulsions. Examples of the chemical sensitization methods include chalcogen sensitization methods (e.g., sulfur sensitization methods, selenium sensitization methods, tellurium sensitization methods), noble metal sensitization methods (e.g., gold sensitization methods), and reduction sensitization methods. The methods may be used singly or in combination. Preferred combinations of the chemical sensitization methods include a combination of a sulfur sensitization method and a gold sensitization method, a combination of a sulfur sensitization method, a selenium sensitization method, and a gold sensitization method, a combination of a sulfur sensitization method, a tellurium sensitization method, and a gold sensitization method, etc.

The sulfur sensitization is generally carried out such that a sulfur sensitizer is added to the emulsion, and the emulsion is stirred at a high temperature of 40° C. or higher for a predetermined time. The sulfur sensitizer may be a known compound, and examples thereof include sulfur compounds contained in gelatin, thiosulfate salts, thiourea compounds, thiazole compounds, and rhodanin compounds. The sulfur compound is preferably a thiosulfate salt or a thiourea compound. The amount of the sulfur sensitizer added per 1 mol of the silver halide is preferably $10^{-7}$ to $10^{-2}$ mol, more preferably $10^{-5}$ to $10^{-3}$ mol, though the amount may be changed depending on various conditions such as pH, temperature, and silver halide particle size in a chemical ripening process.

A selenium sensitizer is used in the selenium sensitization, and it may be a known selenium compound. The selenium sensitization is generally carried out such that an unstable and/or non-unstable selenium compound is added to the emulsion, and the emulsion is stirred at a high temperature of 40° C. or higher for a predetermined time. Examples of the unstable selenium compounds include those described in Japanese Patent Publication Nos. 44-15748 and 43-13489, Japanese Laid-Open Patent Publication Nos. 4-109240 and 4-324855, etc. In particular, a compound represented by the general formula (VIII) or (IX) of Japanese Laid-Open Patent Publication No. 4-324855 is preferably used as the unstable selenium compound.

A tellurium sensitizer is used in the tellurium sensitization for generating silver telluride on or inside the silver halide particle, and the silver telluride is estimated to act as a sensitization nucleus. The rate of the generation of the silver telluride in the silver halide emulsion can be examined by a method described in Japanese Laid-Open Patent Publication No. 5-313284. Specific examples of the tellurium sensitizers include compounds described in U.S. Pat. Nos. 1,623,499, 3,320,069, and 3,772,031; UK Patent Nos. 235,211, 1,121, 496, 1,295,462, and 1,396,696; Canadian Patent No. 800, 958; Japanese Laid-Open Patent Publication Nos. 4-204640, 4-271341, 4-333043, and 5-303157; *J. Chem. Soc., Chem. Commun.*, 635 (1980); *ibid*, 1102 (1979); *ibid*, 645 (1979); *J. Chem. Soc., Perkin. Trans.* 1, 2191 (1980); S. Patai, "*The Chemistry of Organic Selenium and Tellurium Compounds*", Vol. 1 (1986); and *ibid, Vol.* 2 (1987). Particularly preferred are compounds represented by the general formulae (II), (III), and (IV) of Japanese Laid-Open Patent Publication No. 5-313284.

In this embodiment, the amount of the selenium or tellurium sensitizer per 1 mol of the silver halide is generally about $10^{-8}$ to $10^{-2}$ mol, preferably about $10^{-7}$ to $10^{-3}$ mol, though the amount may change depending on the silver halide particles used, the chemical ripening conditions, etc. The chemical sensitization in the present invention is carried out under conditions of a pH of 5 to 8, a pAg of 6 to 11, preferably 7 to 10, and a temperature of 40° C. to 95° C., preferably 45° C. to 85° C., though not particularly restrictive.

The noble metal sensitization may be gold sensitization, platinum sensitization, palladium sensitization, iridium sensitization, or the like, and the gold sensitization is particularly preferred. A gold sensitizer is used in the gold sensitization, and specific examples thereof include chlorauric acid, potassium chloroaurate, potassium aurithiocyanate, gold sulfide, gold (I) thioglucose, and gold (I) thiomannose. The amount of the gold sensitizer per 1 mol of the silver halide may be about $10^{-7}$ to $10^{-2}$ mol. A cadmium salt, a sulfite salt, a lead salt, a thallium salt, or the like may be contained in the silver halide emulsion during the silver halide particle formation or physical ripening process.

The reduction sensitization may be carried out in this embodiment. Examples of reduction sensitizers include stannous salts, amines, formamidinesulfinic acid, and silane compounds. A thiosulfonic acid compound may be added to the silver halide emulsion by a method described in EP-A-293917. In the present invention, only one silver halide emulsion may be used for preparing the photosensitive material, or alternatively a plurality of silver halide emulsions may be used in combination therefor. For example, emulsions different in average particle size, halogen composition, crystal habit, chemical sensitization condition, or sensitivity may be used in combination. It is preferred for increasing the contrast that an emulsion with a higher sensitivity is applied to a region closer to the support as described in Japanese Laid-Open Patent Publication No. 6-324426.

<Binder>

A binder may be used in the emulsion layer to uniformly disperse the silver salt particles and to help the emulsion layer adhere to the support. The binder may be a water-insoluble or water-soluble polymer, and is preferably a water-soluble polymer.

Examples of the binders include gelatins, polyvinyl alcohols (PVA), polyvinyl pyrolidones (PVP), polysaccharides such as starches, celluloses and derivatives thereof, polyethylene oxides, polysaccharides, polyvinylamines, chitosans, polylysines, polyacrylic acids, polyalginic acids, polyhyaluronic acids, and carboxycelluloses. These binders show a neutral, anionic, or cationic property due to ionicity of a functional group.

The amount of the binder in the emulsion layer is not particularly limited, and may be appropriately selected to exhibit the dispersion and adhesion properties.

<Solvent>

The solvent for forming the emulsion layer is not particularly limited, and examples thereof include water, organic solvents (e.g., alcohols such as methanol, ketones such as acetone, amides such as formamide, sulfoxides such as dimethyl sulfoxide, esters such as ethyl acetate, ethers), ionic liquids, and mixtures thereof.

The mass ratio of the solvent to the total of the silver salt, the binder, and the like in the emulsion layer is 30% to 90% by mass, preferably 50% to 80% by mass.

The steps for producing the electromagnetic shielding film will be described below.

[Exposure]

In this embodiment, the composite mesh pattern of the mesh pattern 32 and the pattern of the moire preventing parts 16 in the openings of the mesh pattern 32 may be formed by a printing method or another method such as an exposure development method. In the exposure development method, a photosensitive material having a silver salt-containing layer or a photosensitive material coated with a photopolymer for photolithography is formed on the transparent support 30, and the photosensitive material is exposed. The material may be exposed using an electromagnetic wave. For example, the electromagnetic wave may be a light such as a visible light, an ultraviolet light, a radiation ray including an X-ray. The exposure may be carried out using a light source having a wavelength distribution or a specific wavelength.

The light source may be selected from various illuminants capable of emitting a light in the visible spectral region depending on the intended use. For example, red illuminants, green illuminants, and blue illuminants may be used singly or in combination as the light source. The spectral region is not limited to the red, green, and blue regions, and may be the yellow, orange, or purple region. Also a fluorescent body emitting a light in the infrared region may be used as the light source. A white light emitting cathode ray tube, obtained by combining the illuminants, is often used as the light source. Further, an ultraviolet lamp may be preferably used, and a mercury lamp emitting a g- or i-ray may be used, as the light source.

The exposure for forming the composite mesh pattern may be carried out using a surface exposure method or a scanning exposure method. In the surface exposure method, the photosensitive surface is irradiated with a uniform light through a mask to form an image of a mask pattern. In the scanning exposure method, the photosensitive surface is scanned with a beam of a laser light or the like to form a patterned irradiated area.

In the case of using the former method, the light source is preferably a common tungsten lamp, a halogen lamp for photoprinting, an LED, or a fluorescent lamp, though it may be selected from the above described sources. In this case, the printing exposure may be achieved by a continuous transport exposure process or an intermittent transport/intermittent irradiation exposure process. In the continuous transport process, the rate of transporting the photosensitive surface to be exposed is synchronized with the rate of irradiation with a light modified by the mask. In the intermittent transport/intermittent irradiation process, the transport of the material is stopped temporarily, and the photosensitive surface is flash-exposed.

On the other hand, in the case of using the latter method, while transporting the photosensitive material, the composite mesh pattern image is drawn by moving an irradiation beam in a direction perpendicular to the transporting direction. It is appropriate that a main irradiation for drawing crossline pattern is conducted in combination with an auxiliary irradiation for intermittently irradiating only the intersections to draw the composite mesh pattern image. The main irradiation and the auxiliary irradiation may be simultaneously carried out while transporting the photosensitive surface once. Alternatively, the auxiliary irradiation may be carried out after the scanning exposure by the main irradiation while transporting the photosensitive surface again. In the main irradiation for drawing the crossline pattern, the material may be irradiated continuously with a beam, or the material may be digital irradiated in a pattern intermittently with a beam having a rectangular cross section.

Various laser beams may be used in the exposure. For example, in the exposure in this embodiment, a monochromatic high-density light of a gas laser, a light-emitting diode, a semiconductor laser, or a second harmonic generation (SHG) light source containing a nonlinear optical crystal in combination with a semiconductor laser or a solid laser using a semiconductor laser as an excitation source, etc. is preferably used for scanning exposure. Further, a KrF excimer laser, an ArF excimer laser, an F2 laser, or the like may be used in the exposure. It is more preferred that the exposure is carried out using the semiconductor laser or the second harmonic generation (SHG) light source containing the nonlinear optical crystal in combination with the semiconductor laser or the solid laser to reduce the size and costs of the system. Further, it is most preferred that the exposure is carried out using the semiconductor laser from the viewpoints of reducing the size and costs of the apparatus and improving the durability and stability of the apparatus.

In the case of using the silver halide, the exposure energy is preferably 1 mJ/cm$^2$ or less, more preferably 100 µJ/cm$^2$ or less, further preferably 50 µJ/cm$^2$ or less.

Preferred specific examples of the laser lights include a blue semiconductor laser having a wavelength of 430 to 460 nm (announced by Nichia Corporation in The 48th Meeting of The Japan Society of Applied Physics and Related Societies in March 2001); a green laser having a wavelength of about 530 nm, and converted a semiconductor laser in its wavelength from about 1060 nm by an SHG LiNbO$_3$ crystal having a waveguide-shaped reverse domain structure; a red semiconductor laser having a wavelength of about 685 nm (Hitachi Type No. HL6738MG); and a red semiconductor laser having a wavelength of about 650 nm (Hitachi Type No. HL6501MG).

It is preferred that the silver salt-containing layer is exposed in the pattern by the scanning exposure method using the laser beam. A capstan-type laser scanning exposure apparatus described in Japanese Laid-Open Patent Publication No. 2000-39677 may be preferably used for this exposure. In the capstan-type apparatus, a DMD described in Japanese Laid-Open Patent Publication No. 2004-1244 may be used instead of a rotary polygon mirror in the optical beam scanning system.

[Development Treatment]

In this embodiment, the emulsion layer may be subjected to a development treatment after the exposure. Common development technologies for photographic silver salt films, photographic papers, print engraving films, emulsion masks for photomasking, etc. may be used in the development treatment. A developer for the development treatment is not particularly limited, and may be a PQ developer, an MQ developer, an MAA developer, etc. Examples of commercially available developer usable in this embodiment include CN-16, CR-56, CP45X, FD-3, and PAPITOL available from FUJIFILM Corporation, C-41, E-6, RA-4, D-19, and D-72 available from Eastman Kodak Company, and developers contained in kits thereof. The developer may be a lith developer such as D85 available from Eastman Kodak Company.

In the present invention, by the exposure and development treatments, the metallic silver portion, preferably the patterned metallic silver portion, is formed in the exposed area, and the light transmittable portion to be hereinafter described is formed in the unexposed area.

In the producing method of this embodiment, a dihydroxybenzene developing agent may be used as the developer. Examples of the dihydroxybenzene developing agents include hydroquinone, chlorohydroquinone, isopropylhydroquinone, methylhydroquinone, and hydroquinone monosulfonate, and particularly preferred among them is hydroquinone. The dihydroxybenzene developing agent may be used in combination with an auxiliary developing agent showing superadditivity, such as a 1-phenyl-3-pyrazolidone compound or a p-aminophenol compound. In the producing method according to the present invention, a combination of the dihydroxybenzene developing agent and the 1-phenyl-3-pyrazolidone compound, and a combination of the dihydroxybenzene developing agent and the p-aminophenol compound can be preferably used as the developer.

Specific examples of the 1-phenyl-3-pyrazolidone compounds and derivatives thereof, which can be used as the auxiliary developing agent in combination with the developing agent, include 1-phenyl-3-pyrazolidone, 1-phenyl-4,4-dimethyl-3-pyrazolidone, and 1-phenyl-4-methyl-4-hydroxymethyl-3-pyrazolidone.

Examples of the p-aminophenol-based auxiliary developing agents include N-methyl-p-aminophenol, p-aminophenol, N-(β-hydroxyethyl)-p-aminophenol, and N-(4-hydroxyphenyl)glycine, and preferred among them is N-methyl-p-aminophenol. The amount of the dihydroxybenzene developing agent is generally 0.05 to 0.8 mol/L, and in the present invention the amount is preferably 0.23 mol/L or more, more preferably 0.23 to 0.6 mol/L. When the dihydroxybenzene developing agent is used in combination with the 1-phenyl-3-pyrazolidone compound or the p-aminophenol compound, the amount of the former is preferably 0.23 to 0.6 mol/L, more preferably 0.23 to 0.5 mol/L, and the amount of the latter is preferably 0.06 mol/L or less, more preferably 0.003 to 0.03 mol/L.

In this embodiment, both of a development initiator and a development replenisher preferably have a characteristic that, when 0.1 mol of sodium hydroxide is added to 1 L of the liquid, the pH is increased by 0.5 or less. This characteristic of the development initiator or the development replenisher may be evaluated by the steps of adjusting the pH of the development initiator or the development replenisher to 10.5, adding 0.1 mol of sodium hydroxide to 1 L of the liquid, measuring the pH of the liquid, and judging whether the pH is increased only by 0.5 or less. In the producing method according to the present invention, it is particularly preferred that the development initiator and the development replenisher each show a pH increase of 0.4 or less in the evaluation.

The development initiator and the development replenisher having the above characteristic can be preferably obtained by using a buffer. Examples of the buffers include carbonates; boric acid compounds described in Japanese Laid-Open Patent Publication No. 62-186259; saccharides described in Japanese Laid-Open Patent Publication No. 60-93433, such as saccharose; oxime compounds such as acetoxime; phenol compounds such as 5-sulfosalicylic acid; and tertiary phosphates such as sodium salts and potassium salts. The buffer is preferably a carbonate or boric acid. The amount of the buffer, particularly the carbonate, is preferably 0.25 mol/L or more, particularly preferably 0.25 to 1.5 mol/L.

In this embodiment, the pH of the development initiator is preferably 9.0 to 11.0, particularly preferably 9.5 to 10.7. Also the development replenisher and a development tank in continuous treatment preferably show a pH value within this range. An alkali agent for adjusting the pH may be a common, water-soluble, inorganic alkali metal salt, such as sodium hydroxide, potassium hydroxide, sodium carbonate, or potassium carbonate.

In the producing method of this embodiment, the amount of the development replenisher in the developer, used for treating 1 $m^2$ of the photosensitive material, is 323 mL or less, preferably 30 to 323 mL, particularly 50 to 225 mL. The development replenisher may have the same composition as the development initiator, and may have a content of a component consumed in the development higher than that of the development initiator.

The developer for developing the photosensitive material in this embodiment (both the development initiator and the development replenisher may be hereinafter referred to as the developer) may contain a common additive such as a preservative or a chelating agent. Examples of the preservatives include sulfite salts such as sodium sulfite, potassium sulfite, lithium sulfite, ammonium sulfite, sodium bisulfite, potassium disulfite, and formaldehyde sodium bisulfite. The amount of the sulfite salt is preferably 0.20 mol/L or more, more preferably 0.3 mol/L or more. When the amount of the sulfite salt is excessively large, the sulfite salt causes silver stain in the developer. Thus, the upper limit of the amount of the sulfite salt is preferably 1.2 mol/L. The amount of the sulfite salt is particularly preferably 0.35 to 0.7 mol/L. A small amount of an ascorbic acid derivative may be used in combination with the sulfite salt as the preservative for the dihydroxybenzene developing agent. The ascorbic acid derivative may be ascorbic acid, erythorbic acid (a stereoisomer thereof), or an alkali metal salt thereof (a salt of sodium, potassium, etc.) It is preferred that sodium erythorbate is used as the ascorbic acid derivative from the viewpoint of material cost. The mole ratio of the ascorbic acid derivative to the dihydroxybenzene developing agent is preferably 0.03 to 0.12, particularly preferably 0.05 to 0.10. When the ascorbic acid derivative is used as the preservative, the developer is preferably free from boron compounds.

Examples of the additives for the developer, other than the above ones, include development inhibitors such as sodium bromide and potassium bromide; organic solvents such as ethylene glycol, diethylene glycol, triethylene glycol, and dimethylformamide; development accelerators such as alkanolamines (e.g., diethanolamine, triethanolamine), imidazole, and derivatives thereof; and antifogging agents and black pepper inhibitors, such as mercapto compounds, indazole compounds, benzotriazole compounds, and benzimidazole compounds. Specific examples of the benzimidazole compounds include 5-nitroindazole, 5-p-nitrobenzoylaminoindazole, 1-methyl-5-nitroindazole, 6-nitroindazole, 3-methyl-5-nitroindazole, 5-nitrobenzimidazole, 2-isopropyl-5-nitrobenzimidazole, 5-nitrobenztriazole, sodium 4-[(2-mercapto-1,3,4-thiadiazole-2-yl)thio]butanesulfonate, 5-amino-1,3,4-thiadiazole-2-thiol, methylbenzotriazole, 5-methylbenzotriazole, and 2-mercaptobenzotriazole. The amount of the benzimidazole compound per 1 L of the developer is generally 0.01 to 10 mmol, more preferably 0.1 to 2 mmol.

The developer may contain an organic or inorganic chelating agent. Examples of the inorganic chelating agents include sodium tetrapolyphosphate and sodium hexametaphosphate. Examples of the organic chelating agents include organic carboxylic acids, aminopolycarboxylic acids, organic phosphonic acids, aminophosphonic acids, and organic phosphonocarboxylic acids.

Examples of the organic carboxylic acids include acrylic acid, oxalic acid, malonic acid, succinic acid, glutaric acid, adipic acid, pimelic acid, azelaic acid, sebacic acid, nonanedicarboxylic acid, decanedicarboxylic acid, undecanedicarboxylic acid, maleic acid, itaconic acid, malic acid, citric acid, and tartaric acid, though not restrictive.

Examples of the aminopolycarboxylic acids include iminodiacetic acid, nitrilotriacetic acid, nitrilotripropionic acid, ethylenediaminemonohydroxyethyltriacetic acid, ethylenediaminetetraacetic acid, glycol ether tetraacetic acid, 1,2-diaminopropanetetraacetic acid, diethylenetriaminepentaacetic acid, triethylenetetraminehexaacetic acid, 1,3-diamino-2-propanoltetraacetic acid, glycol ether diaminetetraacetic acid, and compounds described in Japanese Laid-Open Patent Publication Nos. 52-25632, 55-67747, and 57-102624, and Japanese Patent Publication No. 53-40900, etc.

Examples of the organic phosphonic acids include hydroxyalkylidene diphosphonic acids described in U.S. Pat. Nos. 3,214,454 and 3,794,591, and German Patent Publication No. 2227639, etc., and compounds described in *Research Disclosure*, Vol. 181, Item 18170 (May issue, 1979).

Examples of the aminophosphonic acids include aminotris (methylenephosphonic acid), ethylenediaminetetramethylenephosphonic acid, aminotrimethylenephosphonic acid, and compounds described in *Research Disclosure, Vol.* 181, Item 18170, Japanese Laid-Open Patent Publication Nos. 57-208554, 54-61125, 55-29883, and 56-97347, etc.

Examples of the organic phosphonocarboxylic acids include compounds described in Japanese Laid-Open Patent Publication Nos. 52-102726, 53-42730, 54-121127, 55-4024, 55-4025, 55-126241, 55-65955, and 55-65956, and *Research Disclosure*, Vol. 181, Item 18170, etc. These chelating agents may be used in the state of an alkali metal salt or an ammonium salt.

The amount of the chelating agent per 1 L of the developer is preferably $1\times10^{-4}$ to $1\times10^{-1}$ mol, more preferably $1\times10^{-3}$ to $1\times10^{-2}$ mol.

The developer may contain a silver stain inhibitor, and examples thereof include compounds described in Japanese Laid-Open Patent Publication No. 56-24347, Japanese Patent Publication Nos. 56-46585 and 62-2849, and Japanese Laid-Open Patent Publication No. 4-362942. Further, the developer may contain a compound described in Japanese Laid-Open Patent Publication No. 61-267759 as a dissolution aid. Furthermore, the developer may contain a coloring agent, a surfactant, a defoaming agent, a film hardening agent, or the like if necessary. The development temperature and the development time are correlated, and are determined in relation to the overall treatment time. In general, the development temperature is preferably about 20° C. to 50° C., more preferably 25° C. to 45° C., and the development time is preferably 5 seconds to 2 minutes, more preferably 7 to 90 seconds.

It is also preferred that the developer is concentrated, and diluted at the practical use, from the viewpoints of costs for transporting the developer, costs for package material, space saving, etc. Salt components in the developer may be effectively converted to the corresponding potassium salts in the case of concentrating the developer.

In the present invention, the development process may contain a fixation treatment for removing the silver salt in the unexposed area to stabilize the material. The fixation treatment may be carried out using common fixation technologies for photographic silver salt films, photographic papers, print engraving films, emulsion masks for photomasking, etc.

Preferred components of a fixer for the fixation treatment will be described below.

The fixer preferably contains sodium thiosulfate or ammonium thiosulfate, and may contain tartaric acid, citric acid, gluconic acid, boric acid, iminodiacetic acid, 5-sulfosalicylic acid, glucoheptanoic acid, a tiron, ethylenediaminetetraacetic acid, diethylenetriaminepentaacetic acid, nitrilotriacetic acid, a salt thereof, etc., if necessary. It is preferred that the fixer is free of boric acid in view of recent environmental protection. The fixer may contain sodium thiosulfate, ammonium thiosulfate, or the like as a fixing agent. The ammonium thiosulfate is preferred from the viewpoint of fixation rate, while the sodium thiosulfate may be preferably used in view of recent environmental protection. The amount of the known fixing agent may be appropriately controlled, and is generally about 0.1 to 2 mol/L, particularly preferably 0.2 to 1.5 mol/L. The fixer may contain a film hardening agent (such as a water-soluble aluminum compound), a preservative (such as a sulfite or a bisulfite salt), a pH buffer (such as acetic acid), a pH regulator (such as ammonia or sulfuric acid), a chelating agent, a surfactant, a wetting agent, a fixing accelerator, etc., if necessary.

Examples of the surfactants include anionic surfactants such as sulfated products and sulfonated products, polyethylene surfactants, and amphoteric surfactants described in Japanese Laid-Open Patent Publication No. 57-6740. The fixer may contain a known defoaming agent.

Examples of the wetting agents include alkanolamines and alkylene glycols. Examples of the fixing accelerators include thiourea derivatives described in Japanese Patent Publication Nos. 45-35754, 58-122535, and 58-122536; alcohols having a triple bond; thioether compounds described in U.S. Pat. No. 4,126,459; and mesoionic compounds described in Japanese Laid-Open Patent Publication No. 4-229860. Compounds described in Japanese Laid-Open Patent Publication No. 2-44355 may be used as the fixing accelerator. Examples of the pH buffers include organic acids such as acetic acid, malic acid, succinic acid, tartaric acid, citric acid, oxalic acid, maleic acid, glycolic acid, and adipic acid, and inorganic buffers such as boric acid, phosphate salts, and sulfite salts. The pH buffer is preferably acetic acid, tartaric acid, or a sulfite salt. The pH buffer is used to prevent increase in the pH of the fixer due to incorporation of the developer, and the amount thereof is preferably about 0.01 to 1.0 mol/L, more preferably about 0.02 to 0.6 mol/L. The pH of the fixer is preferably 4.0 to 6.5, particularly preferably 4.5 to 6.0. Further, compounds described in Japanese Laid-Open Patent Publication No. 64-4739 may be used as a dye elution accelerator.

Examples of the film hardening agents for the fixer used in the present invention include water-soluble aluminum salts and chromium salts. The film hardening agent is preferably a water-soluble aluminum salt such as aluminum chloride, aluminum sulfate, or potassium alum. The amount of the film hardening agent is preferably 0.01 to 0.2 mol/L, more preferably 0.03 to 0.08 mol/L.

In the fixation treatment, the fixation temperature is preferably about 20° C. to 50° C., more preferably 25° C. to 45° C. The fixation time is preferably 5 seconds to 1 minute, more preferably 7 to 50 seconds. The amount of the fixer is preferably 600 ml/m$^2$ or less, more preferably 500 ml/m$^2$ or less, particularly preferably 300 ml/m$^2$ or less, per the amount of the photosensitive material to be treated.

The developed and fixed photosensitive material is preferably subjected to a water washing treatment or a stabilization treatment. The amount of water used in the water washing treatment or stabilization treatment is generally 20 L or less, and the amount of water supplied may be 3 L or less, per 1 m$^2$ of the photosensitive material. The photosensitive material may be washed with storage water, thus the water amount supplied may be 0. Therefore, the treatment can be carried out without water wasting, and piping for an automatic processing can be dispensed with. The multistage countercurrent method (for example, using two or three stages) has long been known as a method for reducing the washing water amount supplied. By using the multistage countercurrent method in the producing method according to the present invention, the fixed photosensitive material is successively treated in the appropriate order with the treating liquid that is not contaminated with the fixer, so that the water washing treatment can be carried out more efficiently. In the case of using only a small amount of water in the treatment, it is further preferable to use a washing bath with a squeeze roller or a crossover roller described in Japanese Laid-Open Patent Publication Nos. 63-18350 and 62-287252, etc. Such a treatment using a small amount of water may be disadvantageous in high impact on environment, and thus an oxidant or filtration may be used to reduce the impact. Further, the treatment may be carried out such that an antifungal-treated water is introduced into a water washing bath or a stabilization bath according to the above treatment, and the whole or part of the overflow liquid from the bath is utilized for the fixing treatment liquid in the previous treatment, as described in Japanese Laid-Open Patent Publication No. 60-235133. Furthermore, a water-soluble surfactant or a defoaming agent may be added to the treatment liquid to prevent water bubble unevenness, which is easily caused in the treatment using a small amount of water, and/or to prevent a treatment component attached to the squeeze roller from being transferred to the treated film.

In the water washing treatment or stabilization treatment, a dye adsorbent described in Japanese Laid-Open Patent Publication No. 63-163456 may be disposed in the water washing bath to prevent contamination by a dye eluted from the photosensitive material. In the stabilization treatment subsequent to the water washing treatment, a bath containing a compound described in Japanese Laid-Open Patent Publication Nos. 2-201357, 2-132435, 1-102553, and 46-44446 may be used as a final bath for the photosensitive material. In this case, an ammonium compound, a compound of a metal such as Bi or Al, a fluorescent whitening agent, a chelating agent, a film pH regulator, a film hardening agent, a disinfecting agent, a fungicide, an alkanolamine, a surfactant, etc. may be added to the bath if necessary. The water used in the water washing or stabilization treatment may be a tap water, and is preferably a deionized water or a water sterilized with a halogen, an ultraviolet germicidal lamp, an oxidant such as ozone, hydrogen peroxide, or a chlorate salt, etc. Further, the washing water may contain a compound described in Japanese Laid-Open Patent Publication Nos. 4-39652 and 5-241309. In the water washing or stabilization treatment, the bath temperature and the treatment time are preferably 0° C. to 50° C. and 5 seconds to 2 minutes, respectively.

In this embodiment, the treatment liquids such as the developer and the fixer are preferably stored in a packaging material with low oxygen permeability as described in Japanese Laid-Open Patent Publication No. 61-73147. In the case of using a small amount of the treatment liquid, evaporation and air oxidation of the liquid is preferably prevented by reducing the contact area between the liquid and air. A roller transport type automatic processor is described in U.S. Pat. Nos. 3,025,779 and 3,545,971, etc., and it is herein referred to as a roller transport type processor. In general, the roller transport type processor preferably conducts the four steps of development, fixation, water washing, and drying. Also in this embodiment, the roller transport type processor most preferably conducts the four steps, though it may conduct another step such as a quenching step. The four steps may include the stabilization step instead of the water washing step.

In the above steps, the components of the developer or the fixer other than water may be supplied in the solid state, and may be dissolved in water and then used as the developer or fixer. Such a treatment agent is referred to as a solid treatment agent. The solid treatment agent may be in a form of powder, tablet, granule, aggregate, or paste. The treatment agent is preferably in a tablet form or in a form described in Japanese Laid-Open Patent Publication No. 61-259921. The tablet may be prepared by a common method described in Japanese Laid-Open Patent Publication Nos. 51-61837, 54-155038, and 52-88025, UK Patent No. 1,213,808, etc. The granule treatment agent may be prepared by a common method described in Japanese Laid-Open Patent Publication Nos. 2-109042, 2-109043, 3-39735, and 3-39739, etc. The powder treatment agent may be prepared by a common method described in Japanese Laid-Open Patent Publication No. 54-133332, UK Patent Nos. 725,892 and 729,862, German Patent No. 3,733,861, etc.

The bulk density of the solid treatment agent is preferably 0.5 to 6.0 g/cm$^3$, particularly preferably 1.0 to 5.0 g/cm$^3$, in view of the solubility.

The solid treatment agent may be prepared such that at least two layers of granular components reactive with each other are separated by at least one intermediate layer of a substance unreactive with the reactive components, the layer stack is wrapped in a packaging material capable of vacuum packaging, and gas in the material is removed to seal the material. The term "unreactive" used herein means that, when the substance is physically in contact with the reactive component, they are reacted not at all or only slightly under ordinary conditions in the package. The unreactive substance may be any substance as long as it is inactive under the condition where the two reactive components are used for the purpose intended, not to mention a substance unreactive with the two reactive components. The unreactive substance is used together with the two reactive components. For example, though hydroquinone and sodium hydroxide are reacted when they are in direct contact with each other in the developer, they can be stored in the vacuum packaging material for a long period by disposing a separator layer of sodium sulfite, etc. therebetween. Further, hydroquinone, etc. may be formed into a briquette to reduce the contact area with sodium hydroxide, thereby improving the storage stability. A bag composed of an inactive plastic film or an inactive laminate of a plastic substance and a metal foil may be used as the vacuum packaging material.

The ratio of the mass of the metallic silver contained in the exposed area after the development treatment to the mass of silver contained in this area before the exposure is preferably 50% by mass or more, more preferably 80% by mass or more. When the ratio is 50% by mass or more, a high conductivity can be preferably achieved.

In this embodiment, a tone obtained by the development treatment is preferably more than 4.0, though not particularly restrictive. When the tone after the development treatment is more than 4.0, the conductivity of a conductive metal portion can be increased while maintaining high transmittance of the light transmittable portion. For example, the tone of 4.0 or more can be achieved by the above mentioned doping with rhodium or iridium ion.

[Physical Development and Plating Treatment]

In this embodiment, to increase the conductivity of the metallic silver portion formed by the exposure and development, conductive metal particles are deposited on the metallic silver portion by a physical development and/or a plating treatment. The conductive metal particles can be deposited on the metallic silver portion by only one or both of the physical development and the plating treatment in the present invention. The metallic silver portion, on which the conductive metal is deposited by the physical development and/or the plating treatment, is referred to as the conductive metal portion.

In this embodiment, the physical development is such a process that a metal ion such as a silver ion is reduced by a reducing agent, whereby the metal particles are deposited on a nucleus of a metal or a metal compound. Such a physical development has been used in the fields of instant B & W film, instant slide film, printing plate production, etc., and the technologies can be used in the present invention.

The physical development may be carried out at the same time as the above development treatment after the exposure, and may be carried out after the development treatment separately.

In this embodiment, the plating treatment may contain electroless plating (such as chemical reduction plating or displacement plating), electrolytic plating, or a combination thereof. Known electroless plating technologies for printed circuit boards, etc. may be used in the electroless plating in this embodiment. The electroless plating is preferably electroless copper plating.

Examples of chemical species contained in the electroless copper plating solution include copper sulfate, copper chloride, and the like; reducing agents such as formalin and glyoxylic acid; ligands capable of coordinating to copper such as EDTA and triethanolamine; and additives for stabilizing the bath or improving smoothness of a plated film, such as polyethylene glycol, yellow prussiate of potash, and bipyridine.

The electrolytic plating exhibits a higher electrodeposition rate and a more excellent production efficiency, and has more choices of metals to be electrodeposited, as compared with the electroless plating and the physical development. Thus, for the purpose of applying the metal layer onto the developed silver to increase the conductivity of the conductive metal portion, the electrolytic plating is particularly preferred in this embodiment. The electrolytic plating may be carried out using any method appropriately selected from the methods known in the fields of metal processing, printed wiring, etc., as long as the electrodeposition onto the developed silver can be achieved.

The electrolytic plating is preferably electrolytic copper plating. A copper sulfate bath, a copper pyrophosphate bath, etc. may be used as an electrolytic copper plating bath in the electrolytic copper plating.

In this embodiment, the plating treatment may be carried out at a low plating rate or a high plating rate of 5 μm/hr or more. Various additives such as the ligand (e.g. EDTA) may be added to the plating solution to increase the stability of the solution.

[Oxidation Treatment]

In this embodiment, the metallic silver portion formed by the development treatment and the conductive metal portion formed by the physical development and/or the plating treatment are preferably subjected to an oxidation treatment. For example, in a case where a metal is slightly deposited on the light transmittable portion, the metal can be removed by the oxidation treatment, so that the transmittance of the light transmittable portion can be increased to approximately 100%.

The oxidation treatment may be carried out by a known method using an oxidant such as Fe (III) ion. The oxidation treatment may be carried out after the exposure and development treatments of the emulsion layer, or after the physical development or the plating treatment, and may be carried out after the development treatment and after the physical development or plating treatment, respectively.

In this embodiment, the metallic silver portion may be treated with a Pd-containing solution after the exposure and development treatments. The Pd may be in the state of divalent palladium ion or metal palladium. The electroless plating or the physical development can be accelerated by this treatment.

[Conductive Metal Portion]

In the case of using the conductive metal portion according to this embodiment for the light transmittable, electromagnetic shielding material, the metal line pattern preferably has a geometric shape of a combination of triangle (e.g., equilateral triangle, isosceles triangle, right triangle), quadrangle (e.g., square, rectangle, rhombus, parallelogram, trapezoid), (regular) n-gon (e.g., (regular) hexagon, (regular) octagon), circle, ellipse, star, etc. The mesh pattern more preferably has a mesh shape containing the geometric shape. From the viewpoint of EMI shielding property, the triangular shape is most effective. From the viewpoint of visible light transmittance, a shape of (regular) n-gon with larger n is more effective. As the value n is increased, the aperture ratio and the visible light transmittance are advantageously increased, assuming that every shape has the same line width. In the present invention, the pattern of the moire preventing parts is formed in the vicinity of the intersections of the line pattern, in addition to the above-mentioned line pattern.

In the light transmittable, electromagnetic shielding material, the wire width of the conductive metal portion is 1 to 40 μm, preferably 5 to 30 μm, most preferably 10 to 25 μm. The wire distance of the mesh pattern is preferably 50 to 500 μm, more preferably 200 to 400 μm, most preferably 250 to 350 μm. The conductive metal portion may have a part with a wire width of more than 20 μm for the purpose of ground connection, etc.

In this embodiment, the aperture ratio of the conductive metal portion is preferably 85% or more, more preferably 90% or more, most preferably 95% or more, in view of the visible light transmittance. The aperture ratio is a ratio of the light transmittable portions not having the metal forming the composite mesh pattern with respect to the whole area. For example, a square lattice mesh having a wire width of 15 μm and a pitch of 300 μm has an aperture ratio of 90%.

[Light Transmittable Portion]

In this embodiment, the light transmittable portion is a portion having light transmittance, other than the conductive metal portion in the electromagnetic shielding film. The transmittance of the light transmittable portion, which is herein a minimum transmittance value in a wavelength region of 380 to 780 nm, obtained neglecting the light absorption and reflection of the support, is 90% or more, preferably 95% or more, more preferably 97% or more, further preferably 98% or more, most preferably 99% or more.

In this embodiment, it is preferred that the mesh pattern 32 has a continuous structure with a length of 3 m or more for improving the productivity of the electromagnetic shielding film 10. As the length of the continuous structure of the mesh pattern 32 is increased, the productivity can be more improved, and the loss of producing an optical filter material can be reduced. The long roll of the composite mesh pattern according to this embodiment, having the moire preventing parts 16 in the opening portions 14, may be printing-exposed by the surface exposure method of irradiating the roll with a uniform light through a patterned mask or the scanning exposure method of irradiating the roll with a laser beam while transporting, as described above.

The length of the mesh pattern 32 to be continuously printed is preferably 2000 m or less, because when the mesh pattern is fine, the roll becomes disadvantageous in large diameter, heavy weight, and high pressure is applied to the roll center to cause adhesion or deformation, etc. The length is more preferably 100 to 1000 m, further preferably 200 to 800 m, most preferably 300 to 500 m.

For a similar reason, the thickness of the transparent support is preferably 200 μm or less, more preferably 20 to 180 μm, most preferably 50 to 120 μm.

In this embodiment, the mesh pattern may be a so-called lattice pattern containing crossed linear fine wires. The adjacent wires are parallel to each other within an error of plus or minus 2°.

The scanning with the optical beam is preferably carried out using light sources arranged on a line in a direction substantially perpendicular to the transporting direction, or using a rotary polygon mirror. In this case, the optical beam has to undergo binary or more intensity modulation, and dots are continuously formed into a line pattern. Because each fine wire comprises continuous dots, a fine 1-dot wire has a step-like shape. The width of each fine wire is a length in the narrowest part.

In this embodiment, the composite mesh pattern is tilted preferably at 30° to 60°, more preferably at 40° to 50°, most preferably at 43° to 47°, against the transporting direction. In general, it is difficult to prepare a mask for tilting the mesh pattern at about 45° against the frame, and this is likely to result in uneven pattern or increased cost. In contrast, in the present method, the pattern unevenness is rather reduced at the tilt angle of around 45°. Thus, the present invention is more effective in the case of using the method, as compared with the case of using masking exposure photolithography or screen printing.

[Electromagnetic Shielding Film]

In the electromagnetic shielding film 10 of the present invention, the thickness of the transparent support 30 is preferably 5 to 200 μm, more preferably 30 to 150 μm. When the thickness is within the range, a desired visible light transmittance can be obtained, and the film can be easily handled.

The thickness of the metallic silver portion 36, formed on the transparent support 30 before the physical development and/or the plating treatment, can be appropriately selected by controlling the amount of a silver salt-containing layer coating applied to the transparent support 30. The thickness of the metallic silver portion 36 is preferably 30 μm or less, more preferably 20 μm or less, further preferably 0.01 to 9 μm, most preferably 0.05 to 5 μm. The metallic silver portion 36 preferably has a patterned shape. The metallic silver portion 36 may have a monolayer structure or a multilayer structure containing two or more layers. In a case where the metallic silver portion 36 has a patterned multilayer structure containing two or more layers, when the layers may have different wavelength color sensitivities for sensing different wavelengths, different patterns can be formed in the layers by using exposure lights with different wavelengths. The electromagnetic shielding film 10 having such a patterned multilayer metallic silver portion 36 can be used as a high-density printed circuit board.

In the case of using the film as an electromagnetic shielding material for a display, the conductive metal portion preferably has a smaller thickness. As the thickness is reduced, the viewing angle of the display is increased. Further, in the case of using the film as a conductive wiring material, the conductive metal portion preferably has a smaller thickness to increase the density. In view of these points, the thickness of the layer of the conductive metal 40 in the conductive metal portion is preferably less than 9 μm, more preferably at least 0.1 μm and less than 5 μm, further preferably at least 0.1 μm and less than 3 μm.

In this embodiment, the thickness of the metallic silver portion 36 can be controlled by changing the coating thickness of the silver salt-containing layer, and the thickness of the conductive metal particle layer can be controlled in the physical development and/or the plating treatment, whereby an electromagnetic shielding film 10 having a thickness of less than 5 μm, preferably less than 3 μm, can be easily produced.

In conventional etching methods, most of thin metal films must be removed and discarded by etching. In contrast, in this embodiment, the pattern containing only a minimum amount of the conductive metal can be formed on the transparent support 30. Thus, only the minimal amount of the metal is required, so that production costs and metal waste amount can be reduced.

<Adhesive Layer>

When the electromagnetic shielding film 10 according to this embodiment is incorporated in an optical filter, a liquid crystal display board, a plasma display panel, another image display flat panel, an imaging semiconductor integrated circuit such as a CCD, or the like, the electromagnetic shielding film may be bonded thereto by an adhesive layer.

It is preferred that the refractive index difference between the transparent substrate such as a plastic film and an adhesive used in the adhesive layer is reduced to prevent lowering of the visible light transmittance. Thus, the adhesive preferably has a refractive index of 1.40 to 1.70 to prevent the lowering of the visible light transmittance.

The adhesive is preferably capable of being fluidized by applying heat or pressure, and particularly preferably capable of being fluidized by heating at 200° C. or lower or by pressing at 1 kgf/cm$^2$ or more. In this case, the electromagnetic shielding film 10 according to the embodiment, which has the adhesive layer and the conductive layer embedded therein, can be bonded to a body of a display, a plastic plate, etc. by fluidizing the adhesive layer. Since the adhesive can be fluidized, the electromagnetic shielding film 10 can be easily bonded to the body by a lamination or pressing method, particularly by a pressing method, even when the body has a curved surface or a complicated shape. From this point, the adhesive preferably has a softening temperature of 200° C. or lower. The electromagnetic shielding film 10 is generally used at 80° C. or lower, and thus the softening temperature of the adhesive layer is preferably 80° C. or higher and is most preferably 80° C. to 120° C. in view of workability. The softening temperature is a temperature at which the viscosity becomes $10^{12}$ poise or less, and the adhesive is generally fluidized within about 1 to 10 seconds at the temperature.

Typical examples of such adhesives that can be fluidized by applying heat or pressure include thermoplastic resins. Examples of the thermoplastic resins include natural rubbers (refractive index n=1.52); (di)ene polymers such as polyisoprenes (n=1.521), poly-1,2-butadienes (n=1.50), polyisobutenes (n=1.505 to 1.51), polybutenes (n=1.513), poly-2-heptyl-1,3-butadienes (n=1.50), poly-2-t-butyl-1,3-butadienes (n=1.506), and poly-1,3-butadienes (n=1.515); polyethers such as polyoxyethylenes (n=1.456), polyoxypropylenes (n=1.450), polyvinyl ethyl ethers (n=1.454), polyvinyl hexyl ethers (n=1.459), and polyvinyl butyl ethers (n=1.456); polyesters such as polyvinyl acetates (n=1.467) and polyvinyl propionates (n=1.467); polyurethanes (n=1.5 to 1.6); ethylcelluloses (n=1.479); polyvinyl chlorides (n=1.54 to 1.55); polyacrylonitriles (n=1.52); polymethacrylonitriles (n=1.52); polysulfones (n=1.633); polysulfides (n=1.6); phenoxy resins (n=1.5 to 1.6); and poly(meth)acrylates such as polyethyl acrylates (n=1.469), polybutyl acrylates (n=1.466), poly-2-ethylhexyl acrylates (n=1.463), poly-t-butyl acrylates (n=1.464), poly-3-ethoxypropyl acrylates (n=1.465), polyoxycarbonyltetramethylenes (n=1.465), polymethyl acrylates (n=1.472 to 1.480), polyisopropyl methacrylates (n=1.473), polydodecyl methacrylates (n=1.474), polytetradecyl methacrylates (n=1.475), poly-n-propyl methacrylates (n=1.484), poly-3,3,5-trimethylcyclohexyl methacrylates (n=1.484), polyethyl methacrylates (n=1.485), poly-2-nitro-2-methylpropyl methacrylates (n=1.487), poly-1,1-diethylpropyl methacrylates (n=1.489), and polymethyl methacrylates (n=1.489). Two or more of these acrylic polymers may be copolymerized or blended if necessary.

The copolymer resins of the acrylic resins, including epoxy acrylates (n=1.48 to 1.60), urethane acrylates (n=1.5 to 1.6), polyether acrylates (n=1.48 to 1.49), and polyester acrylates (n=1.48 to 1.54), may be used as the adhesive. The urethane acrylates, epoxy acrylates, and polyether acrylates are particularly excellent in adhesiveness. The epoxy acrylates include (meth)acrylic acid adducts of 1,6-hexanediol diglycidyl ether, neopentyl glycol diglycidyl ether, allylalcohol diglycidyl ether, resorcinol diglycidyl ether, diglycidyl adipate, diglycidyl phthalate, polyethylene glycol diglycidyl ether, trimethylolpropane triglycidyl ether, glycerin triglycidyl ether, pentaerythritol tetraglycidyl ether, sorbitol tetraglycidyl ether, etc. Polymers having a hydroxyl group in the molecule, such as the epoxy acryaltes, are effective for improving the adhesion property. Two or more of these copolymer resins may be used in combination if necessary. The softening temperature of the adhesive polymer is preferably 200° C. or lower, more preferably 150° C. or lower, in view of handling. The electromagnetic shielding film is generally used at 80° C. or lower, and the softening temperature of the adhesive layer is most preferably 80° C. to 120° C. in view of workability. The weight-average molecular weight of the polymer is preferably 500 or more. In the present invention, the weight-average molecular weight is obtained by using a calibration curve of a polystyrene standard in a gel permeation chromatography. When the molecular weight is less than 500, the adhesive composition is poor in cohesive force, and thus the adhesiveness may be deteriorated. In this embodiment, the adhesive may contain an additive such as a diluent, a plasticizer, an antioxidant, a filler, a coloring agent, an ultraviolet absorber, or a tackifier, if necessary. The adhesive layer preferably has a thickness of 10 to 80 μm, and particularly preferably has a thickness of 20 to 50 μm greater than that of the conductive layer.

The refractive index difference between the transparent plastic substrate and an adhesive for coating the geometric shape pattern is 0.14 or less. In a case where the conductive material is stacked on a transparent plastic substrate with an adhesion layer disposed in-between, the refractive index difference between the adhesion layer and an adhesive for coating the geometric shape pattern is 0.14 or less. When the refractive index difference between the transparent plastic substrate and the adhesive or between the adhesive and the adhesion layer is large, the visible light transmittance is reduced. When the refractive index difference is 0.14 or less, the reduction in the visible light transmittance is small. In the case of using a polyethylene terephthalate (refractive index n=1.575) for the transparent plastic substrate, examples of satisfactory materials for the adhesive include epoxy resins having a refractive index of 1.55 to 1.60, such as bisphenol A epoxy resins, bisphenol F epoxy resins, tetrahydroxyphenylmethane epoxy resins, novolac epoxy resins, resorcin epoxy resins, polyalcohol or polyglycol epoxy resins, polyolefin epoxy resins, alicyclic epoxy resins, and halogenated bisphenol epoxy resins. Examples of the materials, other than the epoxy resins, include natural rubbers (n=1.52); (di)ene polymers such as polyisoprenes (n=1.521), poly-1,2-butadienes (n=1.50), polyisobutenes (n=1.505 to 1.51), polybutenes (n=1.5125), poly-2-heptyl-1,3-butadienes (n=1.50), poly-2-t-butyl-1,3-butadienes (n=1.506), and poly-1,3-butadienes (n=1.515); polyethers such as polyoxyethylenes (n=1.4563), polyoxypropylenes (n=1.4495), polyvinyl ethyl ethers (n=1.454), polyvinyl hexyl ethers (n=1.4591), and polyvinyl butyl ethers (n=1.4563); polyesters such as polyvinyl acetates (n=1.4665) and polyvinyl propionates (n=1.4665); polyurethanes (n=1.5 to 1.6); ethylcelluloses (n=1.479); polyvinyl chlorides (n=1.54 to 1.55); polyacrylonitriles (n=1.52); polymethacrylonitriles (n=1.52); polysulfones (n=1.633); polysulfides (n=1.6); and phenoxy resins (n=1.5 to 1.6). These materials show a preferred visible light transmittance.

In the case of using an acrylic resin for the transparent plastic substrate, examples of the materials for the adhesive other than the above resins include poly(meth)acrylates such as polyethyl acrylates (n=1.4685), polybutyl acrylates (n=1.466), poly-2-ethylhexyl acrylates (n=1.463), poly-t-butyl acrylates (n=1.4638), poly-3-ethoxypropyl acrylates (n=1.465), polyoxycarbonyl tetramethacrylates (n=1.465), polymethyl acrylates (n=1.472 to 1.480), polyisopropyl methacrylates (n=1.4728), polydodecyl methacrylates (n=1.474), polytetradecyl methacrylates (n=1.4746), poly-n-propyl methacrylates (n=1.484), poly-3,3,5-trimethylcyclohexyl methacrylates (n=1.484), polyethyl methacrylates (n=1.485), poly-2-nitro-2-methylpropyl methacrylates (n=1.4868), polytetracarbanyl methacrylates (n=1.4889), poly-1,1-diethylpropyl methacrylates (n=1.4889), and polymethyl methacrylates (n=1.4893). Two or more of these acrylic polymers may be copolymerized or blended, if necessary.

The copolymer resins of the acrylic resins, including epoxy acrylates, urethane acrylates, polyether acrylates, and polyester acrylates, may be used as the adhesive. The epoxy acrylates and polyether acrylates are particularly excellent in adhesiveness. The epoxy acrylates include (meth)acrylic acid adducts of 1,6-hexanediol diglycidyl ether, neopentyl glycol diglycidyl ether, allylalcohol diglycidyl ether, resorcinol diglycidyl ether, diglycidyl adipate, diglycidyl phthalate, polyethylene glycol diglycidyl ether, trimethylolpropane triglycidyl ether, glycerin triglycidyl ether, pentaerythritol tetraglycidyl ether, sorbitol tetraglycidyl ether, etc. The epoxy acrylate has a hydroxyl group in the molecule, and thereby is effective for improving the adhesion property. These copolymer resins may be used in combination of two or more if necessary. The weight-average molecular weight of a polymer used as a main component of the adhesive is 1,000 or more. When the molecular weight is less than 1,000, the adhesive composition is poor in cohesive force, and thus shows a deteriorated adhesiveness.

Examples of hardening agents used for the adhesive include amines such as triethylenetetramine, xylenediamine, and diaminodiphenylmethane; acid anhydrides such as phthalic anhydride, maleic anhydride, dodecylsuccinic anhydride, pyromellitic anhydride, and benzophenonetetracarboxylic anhydride; diaminodiphenylsulfone; tris(dimethylaminomethyl)phenol; polyamide resins; dicyandiamide; and ethylmethylimidazole. These hardening agents may be used singly or in combination of two or more. The amount of the cross-linking agent is preferably 0.1 to 50 parts by weight, more preferably 1 to 30 parts by weight, per 100 parts by weight of the above polymer. When the amount is less than 0.1 parts by weight, the hardening of the adhesive is insufficient. When the amount is more than 50 parts by weight, the adhesive is excessively cross-linked, resulting in deterioration in adhesiveness. An additive such as a diluent, a plasticizer, an antioxidant, a filler, or a tackifier may be added to a resin composition used as the adhesive in the present invention, if necessary. The transparent plastic substrate having the conductive geometric pattern is partly or entirely coated with the adhesive resin composition, and the applied composition is dried and thermally hardened to prepare an adhesion film. The adhesion film having the electromagnetic shielding property and light transmittance may be directly bonded to a display of CRT, PDP, liquid crystal, EL, etc. by utilizing the adhesiveness thereof. Alternatively, the adhesion film may be bonded to a plate or sheet such as an acrylic plate or a glass plate, and then used in the display. Further, the adhesion film may be used in a window or casing of a measuring apparatus, a measuring instrument, or a producing apparatus generating an electromagnetic wave, to observe the inside thereof. Furthermore, the adhesion film may be used in a window of an automobile or a building, which may be adversely affected by an electromagnetic wave of a radio tower, a high-tension wire, etc. It is preferred that an earth wire is connected to the conductive geometric pattern.

In the transparent plastic substrate, an area not having the conductive material may have a rough surface for increasing the adhesion property. Further, the back shape of the conductive material may be transferred onto the transparent plastic substrate. Thus, a light may be scattered on the surface deteriorating the light transmittance. The scattered reflection on the rough surface can be reduced to the minimum by flatly coating the surface with a resin having a refractive index similar to that of the transparent plastic substrate. The conductive geometric pattern on the transparent plastic substrate has a remarkably small line width, and thus cannot be visually observed by naked eye. Further, the conductive geometric pattern has a sufficiently large pitch, and thus the film is light transmittable apparently. Furthermore, the pitch of the geometric pattern is sufficiently small as compared with the wavelength of the electromagnetic wave to be shielded, and therefore the film can show an excellent shielding property.

As described in Japanese Laid-Open Patent Publication No. 2003-188576, in a case where a film of a highly thermal-adhesive resin such as an ethylene-vinyl acetate copolymer resin or an ionomer resin, or a stack of the film and another resin film is used as the transparent substrate, a metal foil is generally stacked on the transparent substrate by a dry lamination method using an adhesive layer, etc. though they can be stacked without the adhesive layer. Examples of adhesives for the adhesive layer include acrylic resins, polyester resins, polyurethane resins, polyvinyl alcohol resins, vinyl chloride-vinyl acetate copolymer resins, and ethylene-vinyl acetate copolymer resins, and further include thermosetting resins and ionizing radiation hardening resins such as ultraviolet curing resins and electron beam curing resins.

In general, the surface of a display is composed of a glass plate, and the transparent plastic film is bonded to the glass plate by a tacky material. When an air bubble is generated in the adhesion surface or the film is peeled from the glass plate, images may be distorted or a color different from the desired one may be observed disadvantageously. The air bubble generation and the peeling of the film are caused when the tacky material is separated from the plastic film or the glass plate. The tacky material is separated at an adhesion surface of the adhesive and the plastic film or the glass plate, whichever has weaker adhesiveness. Thus, the tacky material needs to have a high adhesiveness to both the plastic film and the glass plate at high temperature. Specifically, the adhesion forces between the tacky material layer and the transparent plastic film and between the tacky material layer and the glass plate are preferably 10 g/cm or more, more preferably 30 g/cm or more, at 80° C. The adhesion force may be more than 2000 g/cm, unless the bonding procedure becomes difficult. An interleaf (separator) may be formed on an area of the tacky material layer, not bonded to the transparent plastic film, to prevent the area from bonding to another component.

The tacky material is preferably transparent. Specifically, the total light transmittance of the tacky material is preferably 70% or more, more preferably 80% or more, most preferably 85% to 92%. Further, the tacky material is preferably low in haze. Specifically, the haze of the tacky material is preferably 0% to 3%, more preferably 0% to 1.5%. It is preferred that the tacky material used in the present invention is colorless from the viewpoint of not changing the displayed original color. Even when the resin for the tacky material is colored, a thinner tacky material layer can be substantially colorless. Further, the tacky material may be purposefully colored as described hereinafter.

Examples of the tacky materials having the above property include acrylic resins, α-olefin resins, vinyl acetate resins, acrylic copolymer resins, urethane resins, epoxy resins, vinylidene chloride resins, vinyl chloride resins, ethylene-vinyl acetate resins, polyamide resins, and polyester resins. Among them, the acrylic resins are preferred. The tackiness of the resin can be improved by reducing the amount of a cross-linking agent, by adding a tackifier, by modifying an end group of the molecule, etc. in the polymerization synthesis of the tacky material. Further, the adhesion property of the tacky material can be improved by modifying the surface to be bonded of the transparent plastic film or the glass plate. The surface may be modified by a physical treatment such as a corona discharge treatment or a plasma glow treatment, or by forming an underlayer for improving the adhesion property.

It is preferred that the tacky material layer has a thickness of about 5 to 50 μm from the viewpoints of the light transmittance, colorless property, and handling property. In the case of using an adhesive for the tacky material layer, the thickness of the adhesive may be reduced within the above range, specifically may be 1 to 20 μm. The thickness may be increased above the range as long as the layer does not change the original color of the display and has a sufficient light transmittance.

<Peelable Protective Film>

A peelable protective film may be formed on the electromagnetic shielding film 10 according to this embodiment.

The protective film is not necessarily disposed on the both surface of the electromagnetic shielding film 10. The protective film may be used such that, as shown in FIG. 2(*a*) of Japanese Laid-Open Patent Publication No. 2003-188576, a protective film (20) is disposed only on a mesh metal foil (11') of a stack (10) and is not disposed on a transparent substrate film (14). Alternatively, the protective film may be used such that, as shown in FIG. 2(*b*) of the patent publication, a protective film (30) is disposed only on a transparent substrate film (14) of a stack (10) and is not disposed on a metal foil (11'). The numerals in parentheses represent referential signs of the above patent publication in this paragraph and the following several paragraphs.

The layer structure and the production of a stack in the electromagnetic shielding film 10 will be described below with reference to FIGS. 3(*a*) to 3(*f*) of the above patent publication. The stack contains at least the transparent support 30 and a light transmittable electromagnetic shielding layer having the mesh pattern 32 with densely arranged opening portions 14. The process of stacking the protective film (the protective film (20) and/or the protective film (30)) will be described after the production of the stack is described.

First, as shown in FIG. 3(a) of the above patent publication, a transparent substrate film (14) (the transparent support 30) and a metal foil (11) are stacked with an adhesion layer (13) disposed therebetween to prepare a stack. The transparent substrate film (14) may be composed of an acrylic resin, a polycarbonate resin, a polypropylene resin, a polyethylene resin, a polystyrene resin, a polyester resin, a cellulose resin, a polysulfone resin, or a polyvinyl chloride resin. In general, the transparent substrate film (14) is preferably composed of a polyester resin excellent in mechanical strength and light transmittance, such as a polyethylene terephthalate resin. The thickness of the transparent substrate film (14) is preferably about 50 to 200 μm and may be above this range in view of the mechanical strength and curving resistance, though not particularly restrictive. The thickness may be smaller than the range in the case of stacking the electromagnetic shielding sheet (1) (the electromagnetic shielding film 10) on another transparent substrate. One or both of the surfaces of the transparent substrate film (14) may be corona discharge-treated or covered with an easy adhesion layer if necessary.

As shown in FIG. 4 of the above patent publication, the electromagnetic shielding sheet (1) is used such that the above stack is placed on a substrate with an infrared cutting filter layer or the like disposed therebetween, and a sheet for strengthening the outermost surface, improving the antireflection property, or improving the antifouling property is placed on the both surfaces of the resultant stack. The protective film has to be peeled off before the further stacking process, and thus the protective film on the metal foil is preferably peelable.

The peeling resistance of the protective film on the metal foil is preferably 5 mN/25 mm width to 5 N/25 mm width, more preferably 10 to 100 mN/25 mm width. When the peeling resistance is less than the lower limit, the protective film can be peeled off too easily by handling or indeliberate contact. On the other hand, when the peeling resistance is more than the upper limit, a large force is required to peel the protective film. Further, when the protective film is peeled, also the mesh metal foil may be disadvantageously separated from the transparent substrate film (or the adhesive layer).

In the electromagnetic shielding sheet (1), the mesh metal foil may be placed on the transparent substrate film (14) with the adhesive layer (13) therebetween to form the stack, and the stack may further contain a black layer. The protective film may be disposed on the lower surface (i.e., the side facing the transparent substrate film) of the stack, to prevent the lower surface of the transparent substrate film from being scratched by handling or indeliberate contact or to prevent the uncovered surface of the transparent substrate film from being contaminated or degraded in the steps of forming and etching a resist layer on the metal foil, particularly in the etching step.

The protective film has to be peeled off before the further stacking process, and thus also the protective film on the transparent substrate film is preferably peelable. The peeling resistance of the protective film on the transparent substrate film is preferably 5 mN/25 mm width to 5 N/25 mm width, more preferably 10 to 100 mN/25 mm width. When the peeling resistance is less than the lower limit, the protective film can be peeled off too easily by handling or indeliberate contact. On the other hand, when the peeling resistance is more than the upper limit, a large force is required to peel the protective film.

It is preferred that the protective film on the transparent substrate film is stable under etching conditions, for example in an etching liquid at 50° C. It is particularly preferred that the protective film is not degraded by an alkali component in the etching liquid when immersed therein for several minutes. It is also preferred that the protective film is stable under dry etching conditions at about 100° C. In a case where the stack is dip-coated (immersion-coated) with a photosensitive resin layer, the coating liquid is attached to the opposite surface of the stack, too. In this case, it is preferred that the protective film is sufficiently bonded to the photosensitive resin to prevent the photosensitive resin from being peeled off and suspended in an etching liquid during etching. Further, it is also preferred that the protective film has resistance against contamination by an etching liquid containing iron chloride, copper chloride, etc., or against corrosion or contamination by a resist remover such as an alkali liquid.

Preferred examples of materials for the protective film include polyolefin resins such as polyethylene resins and polypropylene resins; polyester resins such as polyethylene terephthalate resins; polycarbonate resins; and acrylic resins. From the above described viewpoints, at least a surface of the protective film, which is used as the outermost surface of the stack, is preferably corona discharge-treated or coated with an easy adhesion layer.

Examples of tacky materials for the protective film include acrylate esters, rubbers, and silicones.

The above protective film materials and tacky materials for the protective film on the transparent substrate can be used for the protective film on the metal foil. Thus, the both protective films may be the same or different.

[Blackening Treatment]

A black layer may be formed by a blackening treatment on the transparent substrate film side surface of the metal foil as shown in a structural view of Japanese Laid-Open Patent Publication No. 2003-188576, etc. The black layer can exhibit an antirust property and an antireflection property. For example, the black layer may be formed by Co—Cu alloy plating, and can function to prevent reflection on the surface of the metal foil (11). The black layer may be subjected to an antirust treatment such as a chromate treatment. In the chromate treatment, the metal foil is immersed in a solution containing a chromate or dichromate salt as a main component, and then dried to form an antirust layer. One or both sides of the metal foil may be chromate-treated depending on the intended use. Commercially available chromate-treated copper foils and the like may be used in the present invention. In the case of using a metal foil not blackened beforehand, the metal foil may be subjected to the blackening treatment in any one of the following steps. The black layer may be formed such that a photosensitive resin layer usable as a resist layer is prepared using a black-colored composition, and the resist layer is not removed after the etching. Further, the black layer may be formed by a plating method.

Another example of the structure containing the black layer is described in Japanese Laid-Open Patent Publication No. 11-266095. In the above electromagnetic shielding plate, the black layer such as a first black layer (3a) or a second black layer (3b) may be formed as mentioned below, on a conductive mesh pattern (P) formed by crossing transverse direction lines (x) and longitudinal direction lines (y). In this embodiment, the main subject of the mesh pattern 32 may be formed by one of the metal plating method and the etching method. The method and material for forming the black layer such as the first black layer (3a) or the second black layer (3b) may be selected depending on the method for forming the mesh pattern 32. Thus, in the case of forming the conductive pattern (P) by the metal plating method on the black layer such as the first black layer (3a) or the second black layer (3b), the black layer has to be conductive and capable of being plated with a metal. On the other hand, in the case of forming the black layer in the final step by the etching method, the electrodeposition method, or the like, the black layer can be nonconductive. The conductive black layer can be formed using a conductive metal compound of nickel (Ni), zinc (Zn), copper (Cu), etc. The nonconductive black layer can be formed using a black high-molecular material paste such as a black ink, a chemically blackened material such as a material prepared by chemically modifying a surface of a metal plating layer to form a black compound, an ionic, high-molecular, electrodeposition material such as an electrodeposition coating material, etc. In this embodiment, the method for forming the black layer is appropriately selected depending on the production process of the electromagnetic shielding plate, etc.

As shown in FIG. 5 of Japanese Laid-Open Patent Publication No. 11-266095, the black layer may be formed such that an electrodeposition substrate (14), having a conductive metal substrate (11) and a resist mesh pattern (12) of an insulating film inhibiting electrodeposition, is immersed in an electrolytic solution containing a black copper, a black nickel, etc., and then the substrate is plated by a known electrochemical plating method to form the mesh of the second black layer (3b) composed of a black copper layer, a black nickel layer, etc. In this embodiment, the above black plating bath may contain nickel sulfate as a main component. The black plating bath may be a commercially available bath, and specific examples thereof include an Sn—Ni alloy-based, black plating bath NOBLOY SNC (trade name) available from Shimizu Co., Ltd., an Sn—Ni alloy-based, black plating bath NIKKA BLACK (trade name) available from Nihon Kagaku Sangyo Co., Ltd., and a Cr-based, black plating bath EBONY CHROME 85 series (trade name) available from Kinzoku Kagaku Kogyo Co., Ltd.

The black plating bath may contain Zn, Cu, etc. In the present invention, as shown in FIG. 5 of the above patent publication, a conductive mesh pattern (4) having a desired thickness may be stacked and electrodeposited on the second black layer (3b) by immersing the electrodeposition substrate (14) having the second black layer (3b) in an electrolytic solution of an electromagnetic shielding metal. The material of the conductive mesh pattern (4) is most preferably the above mentioned high-conductive metal. The electrolytic metal solution for forming the electrodeposited metal layer may be appropriately selected depending on the intended purpose from various, common, low-cost, electrolytic metal solutions. Cu has been widely used as a low-cost, high-conductive metal. Though another metal may be used in this embodiment, Cu is suitable for the purpose of this embodiment.

In this embodiment, the mesh pattern 32 may contain a plurality of metal layers. For example, because the mesh pattern 32 of Cu is relatively soft and easily scratched, a protective layer of a common tough metal such as Ni or Cr may be formed on the mesh pattern 32 to prepare an electrodeposited metal layer having a bilayer structure, though not shown in the drawings. The mesh pattern 32 may be subjected to a surface chemical conversion treatment. Specifically, for example, in the case of using copper (Cu) for the mesh pattern 32, the Cu surface is treated with a hydrogen sulfide ($H_2S$) solution and blackened to copper sulfide (CuS), so that the electrodeposited metal layer surface of the mesh pattern 32 is blackened to form the first black layer (3a). Thus, the resultant mesh pattern 32 has a multilayer structure of the second black layer (3b), the conductive pattern layer (4), and the first black layer (3a) formed in this order. A blackening agent for the copper surface used in this embodiment can be easily prepared using a sulfide or a sulfide compound, and can be selected from various commercially available products. Examples thereof include COPPER BLACK CuO, COPPER BLACK CuS, and selenium-based COPPER BLACK No. 65 (trade names) available from Isolate Kagaku Kenkyusho, and EBONOL C SPECIAL (trade name) available from Meltex Inc.

In the electromagnetic shielding plate, an etching resist pattern (35) may be removed or maintained. After the etching resist pattern (35) is removed, the surface of the remaining conductive metal layer (33) may be subjected to a blackening treatment. The blackening treatment may contain a known blackening process such as a plating process using black copper (Cu), black nickel (Ni), etc. or a chemical blackening process.

[Optical Filter]

The optical filter according to this embodiment may have a functional film containing a composite functional layer, in addition to the electromagnetic shielding film.

<Functional Layer>

In general, the viewability of a display screen is reduced due to reflection of a luminaire, etc. Thus, the functional film may have an antireflection (AR) function to prevent the reflection of an external light, an antiglare (AG) function to prevent the reflection of a mirror image, or an antireflection antiglare (ARAG) function containing both the properties. When the surface of the optical filter has a low visible light reflectance, the contrast or the like can be improved while preventing the mirror image.

The functional film with the antireflection function has an antireflection layer. Specifically, the antireflection layer may comprise a thin single layer having a ¼ wavelength optical thickness and a low refractive index of 1.5 or less, preferably 1.4 or less in the visible region, composed of a transparent fluorine-containing polymer resin, magnesium fluoride, a silicone resin, silicon oxide, or the like. Further, the antireflection layer may comprise a stack of 2 or more thin layers having different refractive indices, and each thin layer may contain an inorganic compound such as an oxide, fluoride, silicide, nitride, or sulfide of a metal, or an organic compound such as a silicone resin, an acrylic resin, or a fluorine resin. The antireflection layer is not limited to the examples. In the functional film with the antireflection function, the visible light reflectance of the surface is 2% or less, preferably 1.3% or less, more preferably 0.8% or less.

The functional film with the antiglare function has an antiglare layer transparent to visible light, and the antiglare layer has a small surface roughness of about 0.1 to 10 μm. Specifically, the antiglare layer may be prepared by the steps of dispersing particles of an inorganic or organic compound (such as a silica, an organic silicon compound, a melamine compound, or an acrylic compound) in a heat- or light-hardening resin (such as an acrylic resin, a silicone resin, a melamine resin, a urethane resin, an alkyd resin, or a fluorine resin) to obtain an ink, applying the ink to a base, and hardening the applied ink. The particles have an average particle diameter of 1 to 40 μm. Alternatively, the antiglare layer may be prepared by the steps of applying the heat- or light-hardening resin to the base, and hardening the resin while pressing a mold having a desired glossiness or surface roughness. The preparation of the antiglare layer is not limited to these methods. The haze of the functional film with the antiglare function is 0.5% to 20%, preferably 1% to 10%. Too small haze results in an insufficient antiglare function, and too large haze tends to result in a low sharpness of an image transmitted therethrough.

A hard coating layer having a hard coating function is preferably contained in the functional film to improve the abrasion resistance of the optical filter. The material and formation method of the hard coating layer are not particularly limited, and examples of the materials include heat- or light-hardening resins such as acrylic resins, silicone resins, melamine resins, urethane resins, alkyd resins, and fluorine resins. The hard coating layer has a thickness of about 1 to 50 μm. The surface hardness of the functional hard coating layer is H or more, preferably 2H or more, more preferably 3H or more, by the pencil hardness according to JIS K-5400. It is preferred that the antireflection layer and/or the antiglare layer are formed on the hard coating layer to obtain a functional film having the antireflection function and/or the antiglare function in addition to the abrasion resistance.

Due to static charge in the optical filter, dust is easily attached to the optical filter, and a person is often electrically shocked by electric discharged from touches the optical filter being touched by the person. Therefore, an antistatic treatment is carried out in some cases. Thus, the functional film may be conductive and have an antistatic function to prevent the static charge. In this case, the conductivity may be such that the surface resistance is about $10^{11}$ Ω/sq or less. The functional film may be made conductive by a method of adding an antistatic agent to the film, or by a method of forming a conductive layer in the film, etc. Specific examples of the antistatic agents include PELESTAT (trade name, available from Sanyo Chemical Industries, Ltd.) and ELECTROSTRIPPER (trade name, available from Kao Corporation). Examples of the conductive layers include known transparent conductive layers composed of ITO, etc., and conductive layers composed of a dispersion of conductive ultrafine particles of ITO, tin oxide, etc. It is preferred that the hard coating layer, the antireflection layer, or the antiglare layer contains the conductive layer or the conductive fine particles.

It is preferred that the surface of the functional film has an antifouling function, so that attachment of stain such as fingermark can be prevented, or attached stain can be easily removed. Examples of materials having the antifouling function include those non-wettable by water and/or oil, such as fluorine compounds and silicon compounds. Specifically, for example, OPTOOL (trade name, available from Daikin Industries, Ltd.) may be used as the fluorine-based antifouling agent, and TAKATA QUANTUM (trade name, available from NOF Corporation) may be used as the silicon compound. It is preferred that the antireflection layer contains a layer having the antifouling function.

The functional film preferably has an ultraviolet cutoff function to prevent deterioration of a dye or a polymer film to be hereinafter described. The functional film having the ultraviolet cutoff function may be prepared by a method of adding an ultraviolet absorber in the polymer film, a method of forming an ultraviolet absorbing layer, etc.

In a case where the optical filter is used under a temperature and humidity higher than ordinary temperature and humidity, the dye to be hereinafter described may be deteriorated by water introduced through the film, the water may be aggregated in the tacky material or on the adhesion surface and cause fog in the film, and the tackifier in the tacky material may be phase-separated and deposited by the water and cause fog in the film. Thus, the functional film preferably has a gas barrier function. To prevent the dye deterioration and the fogging, it is important to prevent the impregnation of water into a dye-containing layer and a tacky material layer. The water vapor permeability of the functional film is preferably 10 g/m$^2$·day or less, more preferably 5 g/m$^2$·day or less.

In this embodiment, the polymer film, the conductive mesh layer, the functional film, and a transparent molding to be hereinafter described are bonded by a visible light transmittable tacky material or adhesive (a first and second light transmittable tacky material layers). Specific examples of the tacky materials and the adhesives (the first and second light transmittable tacky material layers) include acrylic adhesives, silicone adhesives, urethane adhesives, polyvinyl butyral (PVB) adhesives, ethylene-vinyl acetate (EVA) adhesives, polyvinyl ethers, saturated amorphous polyesters, and melamine resins. The tacky material and the adhesive may be in any state such as a sheet state or a liquid state, as long as they have practically sufficient bonding strength. The tacky material is preferably a sheet of a pressure-sensitive adhesive. After attaching the tacky material sheet or applying the adhesive, the above components are stacked and bonded. The liquid adhesive may be hardened at room temperature or under heating after the application and bonding. The method for applying the adhesive may be selected from bar coating, reverse coating, gravure coating, die coating, and roll coating methods, etc. depending on the type, viscosity, amount, or the like of the adhesive. The thickness of the layer is not particularly limited, and is generally 0.5 to 50 μm, preferably 1 to 30 μm. It is preferred that a surface, which the tacky material layer is formed on or bonded to, is previously subjected to an easy adhesion treatment such as an easy adhesion coating treatment or a corona discharge treatment to improve the wettability. In the present invention, both the visible light transmittable tacky material and adhesive may be referred to as the light transmittable tacky material.

In this embodiment, the first light transmittable tacky material layer is used particularly for bonding the functional film to the conductive mesh layer. Above described light transmittable tacky materials may be used also in the first light transmittable tacky material layer. It is important that the thickness of the first light transmittable tacky material layer is sufficient to embed a depression of the conductive mesh layer, though any light transmittable tacky material mentioned above can be used. When the first light transmittable tacky material layer is excessively thin as compared with the conductive mesh layer, the conductive mesh layer is insufficiently embedded, so that a space is formed between the layers. As a result, air bubbles are generated in the depression, and the resultant display filter has turbidity and insufficient light transmittance. On the other hand, when the first light transmittable tacky material layer is excessively thick, the production cost is increased, and the handling of the material becomes difficult. When the conductive mesh layer has a thickness of d μm, the thickness of the first light transmittable tacky material layer is preferably within a range of (d−2) to (d+30) μm.

The visible light transmittance of the optical filter is preferably 30% to 85%, more preferably 35% to 70%. When the visible light transmittance is less than 30%, the luminance is excessively reduced to deteriorate visibility. On the other hand, when the visible light transmittance is too high, the optical filter cannot act to improve the contrast of a display. In the present invention, the visible light transmittance is calculated according to JIS R-3106 from wavelength dependence of transmittance in the visible region.

When the functional film is bonded to the conductive mesh layer using the first light transmittable tacky material layer therebetween, air bubbles are generated in the depression, and the resultant filter has turbidity and insufficient light transmittability, in some cases. In such cases, the gas introduced between the components in the bonding step may be removed or solid-dissolved in the tacky material by a pressure treatment, etc., to remove the fogging and to improve the light transmittability. The pressure treatment may be carried out to the stack of the functional film/the first light transmittable tacky material layer/the conductive mesh layer/the polymer film, or to the display filter according to the present embodiment.

The pressure treatment may be carried out using a method of sandwiching the stack between flat plates, a method of transporting the stack between nip rolls, or a method of introducing the stack in a pressure vessel, though the pressurizing method is not particularly limited. The method of introducing the stack in the pressure vessel to apply pressure to the stack is preferred, because in this method a pressure can be uniformly applied to the entire stack without pressing unevenness, and a plurality of stacks can be treated at the same time. The pressure vessel may be an autoclave.

In the pressure treatment, as the pressure is increased, the generated air bubbles can be reduced and the treatment time can be shortened. In view of the pressure resistance of the stack and a limit for a pressurizing apparatus used therein, the pressure is generally about 0.2 to 2 MPa, preferably 0.4 to 1.3 MPa. The pressurizing time depends on various pressurizing conditions and is not particularly limited. As the pressurizing time is increased, also the treatment cost is increased. Thus, it is preferred that the treatment is carried out for 6 hours or less under appropriate pressurizing conditions. Particularly in the method using the pressure vessel, the stack is preferably maintained at the predetermined pressure for about 10 minutes to 3 hours.

In some cases, it is preferred that the stack is heated in the pressure treatment. The fluidity of the light transmittable tacky material can be temporarily increased by heating, whereby the generated air bubbles can be easily removed or solid-dissolved in the tacky material. The heating is generally carried out at about a room temperature to 80° C. in view of the heat resistance of each component of the optical filter, though the heating temperature is not particularly limited.

Further, the adhesion force of each component in the optical filter can be preferably improved by the pressure treatment or the pressure/heating treatment.

In the optical filter according to this embodiment, the second light transmittable tacky material layer is formed on a main surface of the polymer film, on which the conductive mesh layer is not formed. Above described light transmittable tackiness materials may be used also in the second light transmittable tacky material layer, and the material of the layer is not particularly limited. The thickness of the second light transmittable tacky material layer is not particularly limited, and is generally 0.5 to 50 μm, and preferably 1 to 30 μm. It is preferred that the surface, which the second light transmittable tacky material layer is formed on or bonded to, is previously subjected to an easy adhesion treatment such as an easy adhesion coating treatment or a corona discharge treatment to improve the wettability.

A release film may be formed on the second light transmittable tacky material layer. Thus, the filter may have a structure containing at least the functional film/the first light transmittable tacky material layer/the conductive mesh layer/the polymer film/the second light transmittable tacky material layer/the release film. The release film may be formed by coating the tacky material layer side surface of the polymer film with a silicone, etc. When the optical filter according to this embodiment is bonded to a main surface of a transparent molding to be hereinafter described or a display surface (e.g. a front glass of a plasma display panel), the release film is peeled to expose the second light transmittable tacky material layer.

The optical filter according to this embodiment is used mainly for the purpose of shielding an electromagnetic wave from various displays, preferably plasma displays.

As described above, the plasma display generates a near infrared ray with high intensity. Therefore, the optical filter preferably shields not only the electromagnetic wave but also the near infrared ray to the practical level. The transmittance of the optical filter in a wavelength region of 800 to 1000 nm is 25% or less, preferably 15% or less, more preferably 10% or less. Further, the transmitted light color of the optical filter for the plasma display has to be a neutral gray or bluish gray color. This is because, in some cases, it is necessary to maintain or improve the light emission characteristics and contrast of the plasma display, and a white color having color temperature slightly higher than that of a standard white is preferred. Further, it is said that a color plasma display is insufficient in color reproducibility due to unnecessary emission from a fluorescent body or a discharged gas, and it is preferable to selectively reduce the unnecessary emission. In particular, the red color emission spectrum of the display shows several emission peaks over a wavelength region of about 580 to 700 nm, and the purity of the red color is deteriorated by a relatively strong emission peak at a short wavelength, showing an orangish color. The optical property can be controlled by using a dye. Thus, desired optical property can be obtained such that a near infrared absorber is used to cut the near infrared ray, and a dye capable of selectively absorbing the unnecessary emission is used to reduce the emission. Further, also the color tone of the optical filter can be preferably controlled by using a dye capable of absorbing an appropriate visible light.

The dye may be added such that (1) at least one dye is mixed with a transparent resin to form a polymer film or a resin plate, (2) at least one dye is dispersed or dissolved in a high-concentration resin liquid containing an organic solvent and a resin or a resin monomer, and cast into a polymer film or a resin plate, (3) at least one dye is added to a resin binder and an organic solvent to prepare a coating liquid, and applied to a polymer film or a resin plate, or (4) at least one dye is added to a transparent tacky material. The method of adding the dye can be selected from (1) to (4), but is not limited thereto. In this embodiment, the dye may be contained in a substrate, a layer such as a coating, or a tacky material, and may be present on a surface of the substrate or layer.

The dye is not particularly limited, and may be a near infrared absorber, or a common coloring agent or pigment having a desired absorption wavelength in the visible region. Examples of the dyes include common commercially available organic dyes such as anthraquinone dyes, phthalocyanine dyes, methine dyes, azomethine dyes, oxazine dyes, immonium dyes, azo dyes, styryl dyes, coumarin dyes, porphyrin dyes, dibenzofuranone dyes, diketopyrrolopyrrole dyes, rhodamine dyes, xanthene dyes, pyrromethene dyes, dithiol dyes, and diiminium dyes. The type and concentration of the dye are not particularly limited, and may be selected depending on the desired absorption wavelength and absorption coefficient of the dye, the desired transmission property and transmittance of the optical filter, a medium in which the dye is dispersed, and the type and thickness of the coating.

The plasma display panel has a high panel surface temperature. Particularly in the case of using the plasma display panel at a high environmental temperature, also the optical filter has a high temperature. Thus, it is preferred that the dye is heat resistant, and is not significantly deteriorated by decomposition or the like at 80° C. Some dyes are insufficient in light resistance in addition to heat resistance. In a case where an ultraviolet or visible ray in a light emitted from the plasma display or an external light causes a deterioration problem, it is important to use an ultraviolet absorber-containing component or an ultraviolet untransmittable component, thereby reducing the deterioration of the dye due to the ultraviolet, or to use a dye that is not significantly deteriorated by the ultraviolet or visible ray. Problems caused by heat, light, humidity, or a combination thereof can be solved in the same manner. When the dye is deteriorated, the transmission property of the display filter is changed, whereby the color tone is changed or the near infrared cutoff function is reduced. Further, the solubility and dispersion property of the dye in an appropriate solvent are important for dispersing the dye in a medium or coating. In the present invention, two or more dyes having different absorption wavelengths may be contained in one medium or coating, and may be contained in two or more media or coatings respectively.

In this embodiment, the above methods (1) to (4) for adding the dye may be used for forming at least one of dye-containing polymer films, dye-containing functional films, dye-containing, first and second light transmittable tacky material layers, or dye-containing light transmittable tacky materials and adhesives for bonding other components in the optical filter.

Generally the dye is liable to be deteriorated by an ultraviolet ray. The optical filter receives an ultraviolet ray contained in an external light such as a solar light under ordinary use conditions. Thus, it is preferred that at least a dye-containing layer or a layer closer to person, which receives the external light more than the dye-containing layer, has an ultraviolet cutoff function to prevent the deterioration of the dye due to the ultraviolet ray. For example, the dye contained in the polymer film is protected against the ultraviolet in the external light when the first light transmittable tacky material layer and/or the functional film contain an ultraviolet absorber or an ultraviolet cutoff functional layer. The ultraviolet cutoff function for protecting the dye is 20% or less, preferably 10% or less, more preferably 5% or less in the transmittance of the ultraviolet wavelength region of less than 380 nm. The ultraviolet cutoff functional layer may be a layer containing an ultraviolet absorber or an inorganic layer capable of reflecting or absorbing the ultraviolet. The ultraviolet absorber may be a known one such as a benzotriazole absorber or a benzophenone absorber. The type and concentration of the ultraviolet absorber are not particularly limited, and may be selected depending on the dispersion property or solubility in the medium, the absorption wavelength, the absorption coefficient, the thickness of the medium, etc. It is preferred that the layer or film having the ultraviolet cutoff function is poor in absorption in the visible region, and thereby does not significantly reduce the visible light transmittance and does not show a color of yellow, etc. In a case where the functional film has a dye-containing layer, a functional layer, closer to human than the dye-containing layer, may have the ultraviolet cutoff function. In a case where the polymer film contains the dye, a functional layer, closer to human than the polymer film, may have the ultraviolet cutting ability.

The dye can be deteriorated when a metal comes into contact therewith. In the case of using such a dye, the dye is preferably positioned such that the contact between the dye and the conductive mesh layer is prevented as much as possible. Specifically, it is preferred that the functional film, the polymer film, or the light transmittable tacky material layer (D2) contains the dye, and it is particularly preferred that the light transmittable tacky material layer (D2) contains the dye.

In the optical filter according to this embodiment, the polymer film, the conductive mesh layer, the functional film, the first light transmittable tacky material layer, and the second light transmittable tacky material layer are disposed in the order of the functional film/the first light transmittable tacky material layer/the conductive mesh layer/the polymer film/the second light transmittable tacky material layer. It is preferred that a conductive mesh film containing the conductive mesh layer and the polymer film is bonded to the functional film by the first light transmittable tacky material layer, and the second light transmittable tacky material layer is formed on a main surface of the polymer film, opposite to the surface having the conductive mesh layer.

The optical filter according to this embodiment is attached to a display such that the functional film faces the operator, and the second light transmittable tacky material layer faces the display.

The optical filter according to this embodiment may be used on the front surface of the display such that the optical filter is disposed on a support of a transparent molding to be hereinafter described to form a filter-fronted plate, or the optical filter is bonded to the display by the second light transmittable tacky material layer. In the former method, the optical filter can be relatively easily attached, and the transparent support acts to increase the mechanical strength, so that the method is suitable for protecting the display. In the latter method, the resultant optical filter has small weight and thickness since the support is not used, and the reflection on the display surface can be advantageously prevented.

The transparent molding may be a glass plate or a light transmittable plastic plate. The plastic plate is preferred from the viewpoints of mechanical strength, lightweight, and cracking resistance. The glass plate is hardly deformed by heat, and thus is also preferred from the viewpoint of thermal stability. Specifically, the plastic plate may be composed of an acrylic resin such as a polymethyl methacrylate (PMMA), a polycarbonate resin, a transparent ABS resin, etc., and the material of the plastic plate is not limited thereto. Particularly the PMMA has high light transmittance in a wide wavelength region and high mechanical strength, and thereby is preferably used for the plastic plate. The thickness of the plastic plate is not particularly limited, and may be such that the plastic plate has mechanical strength and rigidity sufficient for maintaining the flatness without deflection. The thickness of the plastic plate is generally about 1 to 10 mm. The glass plate is preferably composed of a semi-tempered or tempered glass, which is chemical-tempering-treated or air-cooling-tempering-treated to improve the mechanical strength. The thickness of the glass plate is not particularly limited, and is preferably about 1 to 4 mm in view of the weight. The transparent molding may be subjected to a known pretreatment before bonding the film thereto if necessary. A frame having a color such as a black color may be printed on a portion of the transparent molding, corresponding to the periphery of the optical filter.

In the case of using the transparent molding, the optical filter may have a structure containing at least the functional film/the first light transmittable tacky material layer/the conductive mesh layer/the polymer film/the second light transmittable tacky material layer/the transparent molding. Another functional film may be bonded by a light transmittable tacky material layer to a main surface of the transparent molding, opposite to the surface to be bonded to the second light transmittable tacky material layer. In this case, the functional film and the other functional film may be different in the function and structure. For example, the other functional film may have an antireflection function to reduce the reflection on the back surface of the optical filter having the transparent support. Further, a functional layer such as an antireflection layer may be formed on the main surface of the transparent molding, opposite to the surface to be bonded to the second light transmittable tacky material layer. In this case, the optical filter may be attached to the display such that the functional layer faces the operator. As described above, it is preferred that the dye-containing layer or the outer layer on the side of viewers has the ultraviolet cutoff function.

In general, an electromagnetic wave from a device can be shielded by forming a metal layer in a casing of the device or by using a conductive material in the casing. However, in the case of a light transmittable device such as a display, a window-shaped electromagnetic shielding filter having a light transmittable conductive layer, such as the optical filter according to this embodiment, should be used. The electromagnetic wave is absorbed to the conductive layer, and then induces a charge. Therefore, unless the charge is escaped by grounding, the optical filter acts as an antenna to oscillate the electromagnetic wave, thereby deteriorating the electromagnetic shielding ability. Thus, the optical filter has to be electrically connected to a grounding portion of the display, and the first light transmittable tacky material layer and the functional film need to be formed on the conductive mesh layer while remaining a conducting portion that can electrically conduct from the outside. Though the shape of the conducting portion is not particularly limited, it is important not to form a space, from which the electromagnetic wave is leaked, between the optical filter and the display. It is preferred that the conducting portion is continuously formed on the periphery of the conductive mesh layer. Thus, the conducting portion is preferably provided in a frame shape surrounding the displaying portion of the display.

The conducting portion may be a mesh pattern layer or an unpatterned layer of a solid metal foil or the like. To improve the electric connection between the optical filter and the grounding portion of the display, the unpatterned layer of a solid metal foil or the like is preferred.

In a case where the conducting portion is the unpatterned layer of a solid metal foil or the like, and/or a case where the conducting portion has a sufficient mechanical strength, the conducting portion per se can be preferably used as an electrode.

In some cases, an electrode is preferably formed in the conducting portion to protect the conducting portion and/or to improve the electric connection between the grounding portion and the conducting portion of a mesh pattern layer. The shape of the electrode is not particularly limited, and it is preferred that the entire conducting portion is covered with the electrode.

The material of the electrode may be selected in view of conductivity, corrosion resistance, adhesion to the transparent conductive layer, etc. from simple substances of silver, copper, nickel, aluminum, chromium, iron, zinc, carbon, etc.; alloys thereof; mixtures of a synthetic resin and the simple substance or the alloy; and mixtures of a borosilicate glass and the simple substance or the alloy. The electrode may be formed by using a paste of the material, and the paste may be printed or applied by a known method. Further, a commercially available conductive tape may be preferably used as the electrode. The both surfaces of the conductive tape are conductive, and the conductive tape may be a single- or double-faced tape using a carbon-dispersed conductive adhesive. The thickness of the electrode is not particularly limited, and is generally about several μm to several mm.

The optical filter according to this embodiment has excellent optical property, and thereby can maintain or improve the image quality of the plasma display without significant deterioration of the luminance. Further, the optical filter has excellent electromagnetic shielding ability, and thereby can shield the electromagnetic wave from the plasma display, which has a possibility of damaging health. Furthermore, the optical filter can efficiently cut the near infrared ray around 800 to 1000 nm emitted from the plasma display to reduce the adverse affect of the ray on peripheral electronic devices such as remote controls and optical communication transmission systems, and thus can prevent malfunction of the devices. Furthermore, the optical filter can be produced at low cost with excellent weather resistance.

First Example

The present invention will be described more specifically below with reference to Examples. Materials, amounts, ratios, treatment contents, treatment procedures, and the like, used in Examples, may be changed without departing from the scope of the invention. The following examples are, therefore, to be considered in all respects as illustrative and not restrictive.

(Photosensitive Silver Halide Material)

An emulsion, which contained an aqueous medium, a gelatin, and silver iodobromochloride particles (I content: 0.2 mol %, Br content: 40 moil, average spherical equivalent diameter: 0.1 μm), was prepared. The amount of the gelatin was 10.0 g per 60 g of Ag.

$K_3Rh_2Br_9$ and $K_2IrCl_6$ were added to the emulsion at a concentration of $10^{-7}$ mol/mol silver to dope the silver bromide particles with Rh and Ir ions. Further, $Na_2PdCl_4$ was added to the emulsion, and the resultant emulsion was gold-sulfur-sensitized using chlorauric acid and sodium thiosulfate. The obtained emulsion and a gelatin hardening agent were applied to a polyethylene terephthalate (PET) support such that the amount of the silver applied was 1 g/m². The Ag/gelatin volume ratio was 1/2, the PET support had a width of 30 cm, and the emulsion was applied into a width of 25 cm and a length of 20 m.

The both end portions having a width of 3 cm were cut off to obtain a roll photosensitive silver halide material having a width of 24 cm.

(Exposure)

The photosensitive silver halide material was exposed by using a continuous exposure apparatus. In the apparatus, exposure heads using a DMD (a digital mirror device) described in Japanese Laid-Open Patent Publication No. 2004-1244 were arranged into a width of 25 cm. The exposure heads and exposure stages were arranged on a curved line to concentrate laser lights onto the photosensitive layer of the photosensitive material. Further, in the apparatus, a feeding mechanism and a winding mechanism for the photosensitive material were disposed, and a buffering bend was formed such that the speed in the exposure part was not affected by changing the exposure surface tension, and feeding and winding speeds. The light for the exposure had a wavelength of 400 nm and a beam shape of 12-μm square, and the output of the laser light source was 100 μJ.

The photosensitive material was exposed in a lattice pattern with a width of 24 cm and a length of 10 m. In the pattern, 12-μm pixels were tilted at 45 degree at a pitch of 300 μm. The exposure was carried out under the following conditions to print a mesh pattern. The wire width of the conductive portion, the position of the moire preventing part, etc. in the mesh pattern are shown in Table 1.

A composite mesh pattern, containing the mesh pattern 32 and the pattern of the moire preventing parts 16 in the opening portions 14, was formed by an exposure method using three exposure heads in combination.

This exposure method is described below. By using the first exposure head, the photosensitive layer is irradiated with a constant laser beam while reciprocating the laser beam in the direction perpendicular to the direction of transporting the photosensitive layer, to draw an exposure pattern on the photosensitive layer. Thus, the pattern is drawn by the beam at 45° in accordance with the ratio of the photosensitive layer transporting speed and the head reciprocating speed in the perpendicular direction. After the laser beam reaches an end of the photosensitive layer, the pattern is drawn at the reversed angle depending on the reciprocal motion of the head.

By using the second exposure head, in the same manner as the first exposure head, the photosensitive layer is irradiated with a constant laser beam while reciprocating the laser beam in the direction perpendicular to the direction of transporting the layer, to draw an exposure pattern on the layer. The motion start point of the second exposure head is different from that of the first exposure head by 180 degree or the multiple. Thus, when the first exposure head is moved obliquely from one end of the photosensitive layer, the second exposure head is moved obliquely from the other end in the opposite direction, so that the mesh pattern 32 is formed.

The third exposure head is a fixed type head, while the first and second exposure heads are mobile type heads that can be reciprocated in the direction perpendicular to the photosensitive layer transporting direction. The third exposure head is positioned approximately at the center of the opening portion 14 of the mesh pattern 32. To dispose a number of the opening portions 14 in the width direction of the photosensitive layer, the same number of the third heads is used. The laser emission frequency of the third head is set such that the photosensitive layer is irradiated with a laser beam intermittently only when the third head is on the opening portion. Further, the emission time is set such that the resultant moire preventing part has a desired size.

(Development Treatment)

| Formulation of 1 L of developer | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | 10.3 |

| Formulation of 1 L of fixer | | |
|---|---|---|
| Ammonium thiosulfate solution (75%) | 300 | ml |
| Ammonium sulfite monohydrate | 25 | g |
| 1,3-Diaminopropanetetraacetic acid | 8 | g |
| Acetic acid | 5 | g |
| Aqueous ammonia (27%) | 1 | g |
| pH | 6.2 | |

The exposed photosensitive material was treated with the above treatment agents under the following conditions using an automatic processor FG-710PTS manufactured by FUJIFILM Corporation. Thus, a development treatment was carried out at 35° C. for 30 seconds, a fixation treatment was carried out at 34° C. for 23 seconds, and a water washing treatment was carried out for 20 seconds at a water flow rate of 5 L/min.

The running conditions were such that the amount of the photosensitive material treated was 100 m$^2$/day, the replenishment amount of the developer was 500 ml/m$^2$, the replenishment amount of the fixer was 640 ml/m$^2$, and the treatment period was 3 days. It was confirmed that a copper pattern had a wire width of 12 µm and a pitch of 300 µm after a plating treatment.

The material was subjected to an electroless copper plating treatment at 45° C. using an electroless plating solution (an electroless Cu plating solution having a pH of 12.5, containing 0.06 mol/L of copper sulfate, 0.22 mol/L of formalin, 0.12 mol/L of triethanolamine, 100 ppm of a polyethylene glycol, 50 ppm of yellow prussiate of potash, and 20 ppm of α,α'-bipyridine). The material was then subjected to an oxidation treatment using an aqueous solution containing 10 ppm of Fe (III) ion, to produce an electromagnetic shielding film.

As shown in Table 1, in Example, the conductive portion 12 of the mesh pattern 32 had a wire width of 14 µm, and the moire preventing part 16 was formed at the center of the opening portion 14 (for example, at the intersection point of the first line 20a and the second line 20b shown in FIG. 2B).

[Evaluation]

(Measurement of Surface Resistance)

200 areas were optionally selected in a sample of the electromagnetic shielding film, and the surface resistances of the areas were measured by LORESTA GP (Model No. MCP-T610) manufactured by Dia Instruments Co., Ltd. utilizing an in-line four-probe method (ASP), to evaluate the uniformity of surface resistance.

(Evaluation of Moire)

The original electromagnetic shielding film of a PDP TH-42PX300 manufactured by Matsushita Electric Industrial Co., Ltd. was detached from the PDP body. A turntable was disposed on the PDP body for the purpose of attaching the above produced electromagnetic shielding film thereto. The turntable was a glass plate having a thickness of 5 mm, usable as a front plate of the PDP. Further, the turntable had an angle scale for measuring the bias angle of the attached electromagnetic shielding film. The PDP was turned on, and a pattern generator (ASTROVG828D) was connected to an HDMI terminal of the PDP. A white 255 signal was transmitted at the maximum output from the pattern generator to the PDP. The electromagnetic shielding film was fixed to the turntable using a tape to prevent the deflection. The moire of the electromagnetic shielding film was visually observed and evaluated in a dark room while turning the turntable within a bias angle range of −45° to +45°. The moire was observed at a distance of 1.5 m from the PDP while changing the bias angle, and evaluated as Excellent, Good, or Poor. Excellent means that the moire was not visible, Good means that the moire was slightly visible to an acceptable extent, and Poor means that the moire was highly visible. In the overall evaluation, each electromagnetic shielding film was evaluated as A, B, C, or D. A means that the film was evaluated as Excellent in an angular range of 10° or more, B means that the film was evaluated as Excellent in an angular range of less than 10°, C means that the film was not evaluated as Excellent at any angle and was evaluated as Poor in an angular range of less than 10°, and D means that the film was not evaluated as Excellent at any angle and was evaluated as Poor in an angular range of 10° or more.

(Evaluation Result)

As shown in Table 1, the electromagnetic shielding film of Example was excellent in conductivity and light transmittance without visible moire.

It is clear from the evaluation results that, by forming the moire preventing part 16 in the opening portion 14 of the mesh pattern 32, the moire can be prevented while achieving excellent conductivity and light transmittance.

TABLE 1

| | Sa ($\mu m^2$) | Sb ($\mu m^2$) | Wire Width ($\mu m$) | Moire | Conductivity | Light Transmittance |
|---|---|---|---|---|---|---|
| Example | 196 | 49 | 14 | A | Good | Good |

Second Example

Films of Examples 1 to 21 and Comparative Examples 1 to 3 were produced and the moire, conductivity, and light transmittance of each film were evaluated in the same manner as First Example. The conditions and the evaluation results of Examples 1 to 21 and Comparative Examples 1 to 3 are shown in Table 2.

Examples 1 to 21

As shown in Table 2, in Examples 1 to 7, the conductive portion 12 of the mesh pattern 32 had a wire width of 14 $\mu m$, and the moire preventing part 16 was formed at the center of the opening portion 14. The ratios (Sb/Sa) of the area Sb of the intersection 18 to the area Sa of the moire preventing part 16 were 0.1, 0.5, 0.9, 1.0, 1.1, 1.5, and 1.9, respectively.

In Examples 8 to 14, the conductive portion 12 of the mesh pattern 32 had a wire width of 21 $\mu m$, and the moire preventing part 16 was formed at the center of the opening portion 14. The ratios (Sb/Sa) of the area Sb of the intersection 18 to the area Sa of the moire preventing part 16 were 0.1, 0.5, 0.9, 1.0, 1.1, 1.5, and 1.9, respectively.

In Examples 15 to 21, the conductive portion 12 of the mesh pattern 32 had a wire width of 28 $\mu m$, and the moire preventing part 16 was formed at the center of the opening portion 14. The ratios (Sb/Sa) of the area Sb of the intersection 18 to the area Sa of the moire preventing part 16 were 0.1, 0.5, 0.9, 1.0, 1.1, 1.5, and 1.9, respectively.

Comparative Examples 1 to 3

In Comparative Example 1, the wire width was 14 $\mu m$, and the moire preventing part 16 was not formed. In Comparative Example 2, the wire width was 21 $\mu m$, and the moire preventing part 16 was not formed. In Comparative Example 3, the wire width was 28 $\mu m$, and the moire preventing part 16 was not formed.

[Evaluation]
(Measurement of Surface Resistance)

The surface resistance was evaluated in the same manner as First Example.

(Evaluation of Moire)

The moire was evaluated in the same manner as First Example.

(Evaluation Result)

The results are shown in Table 2. In Comparative Examples 1, 2 and 3, the moire was highly visible and evaluated as C.

In contrast, the films of Examples 1 to 21 exhibited excellent conductivity and excellent light transmittance without the moire problem. Particularly in Examples 4, 11 and 18 using the ratios (Sb/Sa) of 1.0, the moire was not visible and evaluated as A.

It is clear from the evaluation results that, when the area Sa of the intersection 18 and the area Sb of the moire preventing part 16 satisfy the inequality 0.1Sa≤Sb≤1.9Sa, the conductivity and light transmittance can be improved without the moire problem. Particularly when the area Sa and the area Sb satisfy the equality (Sb/Sa)=1.0, the moire can be prevented more effectively.

TABLE 2

| | Wire Width ($\mu m$) | Sb ($\mu m^2$) | Sb/Sa | Moire | Conductivity | Light Transmittance |
|---|---|---|---|---|---|---|
| Comparative Example 1 | 14 | 0.0 | 0.0 | C | Good | Good |
| Example 1 | 14 | 19.6 | 0.1 | B | Good | Good |
| Example 2 | 14 | 98.0 | 0.5 | A | Good | Good |
| Example 3 | 14 | 176.4 | 0.9 | A | Good | Good |
| Example 4 | 14 | 196.0 | 1.0 | A | Good | Good |
| Example 5 | 14 | 215.6 | 1.1 | A | Good | Good |
| Example 6 | 14 | 294.0 | 1.5 | A | Good | Good |
| Example 7 | 14 | 372.4 | 1.9 | B | Good | Good |
| Comparative Example 2 | 21 | 0.0 | 0.0 | C | Excellent | Good |
| Example 8 | 21 | 44.1 | 0.1 | B | Excellent | Good |
| Example 9 | 21 | 220.5 | 0.5 | B | Excellent | Good |
| Example 10 | 21 | 396.9 | 0.9 | A | Excellent | Good |
| Example 11 | 21 | 441.0 | 1.0 | A | Excellent | Good |
| Example 12 | 21 | 485.1 | 1.1 | A | Excellent | Good |
| Example 13 | 21 | 661.5 | 1.5 | B | Excellent | Good |
| Example 14 | 21 | 837.9 | 1.9 | B | Excellent | Good |
| Comparative Example 3 | 28 | 0.0 | 0.0 | C | Excellent | Good |
| Example 15 | 28 | 78.4 | 0.1 | B | Excellent | Good |
| Example 16 | 28 | 392.0 | 0.5 | B | Excellent | Good |
| Example 17 | 28 | 705.6 | 0.9 | B | Excellent | Good |
| Example 18 | 28 | 784.0 | 1.0 | A | Excellent | Good |
| Example 19 | 28 | 862.4 | 1.1 | B | Excellent | Good |
| Example 20 | 28 | 1176.0 | 1.5 | B | Excellent | Good |
| Example 21 | 28 | 1489.6 | 1.9 | B | Excellent | Good |

Third Example

The electromagnetic shielding film of Example of First Example (Example 4 of Second Example) was treated with a copper blackening liquid, so that the copper surface was blackened. The blackening liquid used was COPPER BLACK commercially available from Isolate Kagaku Kenkyusho. Then, a protective film having a total thickness of 28 $\mu m$ (Model No. HT-25 available from Panac Industries, Inc.) was attached to the PET surface using a laminator roller.

Further, a protective film having a total thickness of 65 $\mu m$ (SUNYTECT Y-26F (trade name) available from Sun A. Kaken Co., Ltd.), prepared by stacking an acrylic tacky material layer on a polyethylene film, was attached to the electromagnetic shielding film side (the mesh pattern side) using a laminator roller.

The PET surface was attached to a glass plate having a thickness of 2.5 mm and an overall size of 950 mm×550 mm, using a transparent acrylic tacky material therebetween.

Then, an antireflection near infrared absorbing film (CLEARAS AR/NIR (trade name) available from Sumitomo Osaka Cement Co., Ltd.), having a 100-$\mu m$-thick PET film, an antireflection layer, and a near infrared absorber-containing layer, was attached to the inner region of the conductivity mesh layer other than the 20-mm-wide outer edge areas, disposing a 25-$\mu m$-thick, acrylic, light transmittable tacky material therebetween. Toning dyes for controlling the transmittance of a display filter (PS-Red-G and PS-Violet-RC available from Mitsui Chemicals, Inc.) were added to the layer of the acrylic light transmittable tacky material. Further, an antireflection film (REALOOK 8201 (trade name) available from NOF Corporation) was attached by a tacky material to the opposite main surface of the glass plate, to produce a display filter.

The obtained display filter had a remarkably small number of scratches and defects in the metal mesh since the protective film was used on the electromagnetic shielding film. The display image was not metal-colored by the electromagnetic shielding film since the metal mesh was blackened. Further, the display filter had practically satisfactory electromagnetic shielding ability and near infrared cutoff function (had a transmittance of 15% or less in a region of 300 to 800 nm), and exhibited an excellent viewability due to the antireflection layers on both sides. Furthermore, the display filter had a toning function due to the added dyes, and thereby can be suitably used in plasma display devices, etc.

The light transmittable, electromagnetic shielding film and the optical filter of the present invention are not limited to the above embodiments, and various changes and modifications can be made without departing from the scope of the invention.

What is claimed is:

1. A light transmittable conductive film comprising a transparent support, and a mesh pattern of a conductive metal thin film formed on the transparent support, the conductive metal thin film comprising a conductive portion and an opening portion, wherein a moire preventing part is formed approximately at a center of said opening portion.

2. The light transmittable conductive film according to claim 1, wherein intersections facing each other are formed in said conductive portion in said mesh pattern, and said moiré preventing part is formed on a line connecting said intersections in said opening portion.

3. The light transmittable conductive film according to claim 2, wherein a first intersection and a second intersection facing each other and a third intersection and a fourth intersection facing each other are formed around said opening portion, and said moire preventing part is formed at an intersection point of a first line connecting said first intersection and said second intersection and a second line connecting said third intersection and said fourth intersection.

4. The light transmittable conductive film according to claim 1, wherein said light transmittable conductive film satisfies the following inequality:

$0.1Sa \leq Sb \leq 5.0Sa$ wherein Sa is an area of an intersection in said conductive portion and Sb is an area of said moire preventing part.

5. The light transmittable conductive film according to claim 1, wherein said light transmittable conductive film satisfies the following inequality:

$0.1Sa \leq Sb \leq 1.9Sa$ wherein Sa is an area of an intersection in said conductive portion and Sb is an area of said moire preventing part.

6. The light transmittable conductive film according to claim 1, wherein said moire preventing part has a substantially circular planar shape.

7. The light transmittable conductive film according to claim 1, wherein said moire preventing part has a polygonal planar shape.

8. The light transmittable conductive film according to claim 1, wherein said moire preventing part has an at least partially curved planar shape.

9. A mesh conductive metal thin film comprising a transparent support, and a mesh conductive portion and an opening portion formed on said transparent support, wherein a metal layer is formed approximately at a center of said opening portion, the metal layer being in non-connected state with said conductive portion.

10. The mesh conductive metal thin film according to claim 9, wherein intersections facing each other are formed in said mesh conductive portion, and said metal layer is formed on a line connecting said intersections in said opening portion.

11. The mesh conductive metal thin film according to claim 10, wherein a first intersection and a second intersection facing each other and a third intersection and a fourth intersection facing each other are formed around said opening portion, and said metal layer is formed at an intersection point of a first line connecting said first intersection and said second intersection and a second line connecting said third intersection and said fourth intersection.

12. The mesh conductive metal thin film according to claim 9, wherein said mesh conductive metal thin film satisfies the following inequality:

$0.1Sa \leq Sb \leq 5.0Sa$ wherein Sa is an area of an intersection in said mesh conductive portion and Sb is an area of said metal layer.

13. The mesh conductive metal thin film according to claim 9, wherein said mesh conductive metal thin film satisfies the following inequality:

$0.1Sa \leq Sb \leq 1.9Sa$ wherein Sa is an area of an intersection in said mesh conductive portion and Sb is an area of said metal layer.

14. A mesh conductive metal thin film comprising a transparent support, and a mesh conductive portion formed on said transparent support, wherein said mesh conductive metal thin film comprises a metal layer between two intersections in said mesh conductive portion, the metal layer being in nonconnected state with said conductive portion.

15. The mesh conductive metal thin film according to claim 14, wherein said metal layer is formed at an intersection point of a first line connecting a first intersection and a second intersection and a second line connecting a third intersection and a fourth intersection, in said mesh conductive portion.

16. The mesh conductive metal thin film according to claim 14, wherein said mesh conductive metal thin film satisfies the following inequality:

$0.1Sa \leq Sb \leq 5.0Sa$ wherein Sa is an area of said intersection in said mesh conductive portion and Sb is an area of said metal layer.

17. The mesh conductive metal thin film according to claim 14, wherein said mesh conductive metal thin film satisfies the following inequality:

$0.1Sa \leq Sb \leq 1.9Sa$ wherein Sa is an area of said intersection in said mesh conductive portion and Sb is an area of said metal layer.

* * * * *